(12) United States Patent
Omura

(10) Patent No.: US 8,339,578 B2
(45) Date of Patent: Dec. 25, 2012

(54) OPTICAL SYSTEM, EXPOSURE SYSTEM, AND EXPOSURE METHOD

(75) Inventor: Yasuhiro Omura, Kounosu (JP)

(73) Assignee: Nikon Corporation, Tokyo (JP)

( * ) Notice: Subject to any disclaimer, the term of this patent is extended or adjusted under 35 U.S.C. 154(b) by 372 days.

(21) Appl. No.: 12/656,637

(22) Filed: Feb. 5, 2010

(65) Prior Publication Data
US 2010/0141921 A1 Jun. 10, 2010

Related U.S. Application Data

(62) Division of application No. 10/587,254, filed as application No. PCT/JP2005/000406 on Jan. 14, 2005.

(30) Foreign Application Priority Data

Jan. 27, 2004 (JP) .................................. 2004-018226
Nov. 24, 2004 (JP) .................................. 2004-338749

(51) Int. Cl.
| | |
|---|---|
| G02B 5/30 | (2006.01) |
| G02B 27/28 | (2006.01) |
| G03B 27/32 | (2006.01) |
| G03B 27/42 | (2006.01) |
| G03B 27/54 | (2006.01) |
| G03B 27/72 | (2006.01) |

(52) U.S. Cl. ................ 355/71; 355/53; 355/67; 355/77; 359/489.14; 359/489.18; 359/492.01

(58) Field of Classification Search ..................... 355/53, 355/67, 71, 77; 359/237–238, 352, 371, 359/386, 486.01–486.03, 489.14–489.16, 359/489.18, 492.01, 900
See application file for complete search history.

(56) References Cited

U.S. PATENT DOCUMENTS

| | | |
|---|---|---|
| 3,758,201 A | 9/1973 | MacNeille |
| 3,892,470 A | 7/1975 | Lotspeich |
| 4,744,615 A | 5/1988 | Fan et al. |
| 4,755,027 A | 7/1988 | Schafer |
| 5,312,513 A | 5/1994 | Florence et al. |

(Continued)

FOREIGN PATENT DOCUMENTS

EP 0 230 931 A2 8/1987

(Continued)

OTHER PUBLICATIONS

Jun. 7, 2011 Office Action issued in U.S. Appl. No. 12/656,639.

(Continued)

*Primary Examiner* — Hung Henry Nguyen
*Assistant Examiner* — Colin Kreutzer
(74) *Attorney, Agent, or Firm* — Oliff & Berridge, PLC

(57) ABSTRACT

An optical system is able to achieve a substantially azimuthal polarization state in a lens aperture while suppressing loss of light quantity, based on a simple configuration. The optical system of the present invention is provided with a birefringent element for achieving a substantially circumferential distribution or a substantially radial distribution as a fast axis distribution in a lens aperture, and an optical rotator located behind the birefringent element and adapted to rotate a polarization state in the lens aperture. The birefringent element has an optically transparent member which is made of a uniaxial crystal material and a crystallographic axis of which is arranged substantially in parallel with an optical axis of the optical system. A light beam of substantially spherical waves in a substantially circular polarization state is incident to the optically transparent member.

31 Claims, 29 Drawing Sheets

U.S. PATENT DOCUMENTS

| | | | |
|---|---|---|---|
| 5,345,292 A | 9/1994 | Shiozawa et al. | |
| 5,459,000 A | 10/1995 | Unno | |
| 5,541,026 A | 7/1996 | Matsumoto | |
| 5,559,583 A | 9/1996 | Tanabe | |
| 5,621,498 A | 4/1997 | Inoue et al. | |
| 5,627,626 A | 5/1997 | Inoue et al. | |
| 5,631,721 A | 5/1997 | Stanton et al. | |
| 5,663,785 A | 9/1997 | Kirk et al. | |
| 5,673,103 A | 9/1997 | Inoue et al. | |
| 5,677,755 A | 10/1997 | Oshida et al. | |
| 5,707,501 A | 1/1998 | Inoue et al. | |
| 5,739,898 A | 4/1998 | Ozawa et al. | |
| 5,841,500 A | 11/1998 | Patel | |
| 5,933,219 A | 8/1999 | Unno | |
| 5,969,441 A | 10/1999 | Loopstra et al. | |
| 6,031,658 A | 2/2000 | Riza | |
| 6,191,880 B1 | 2/2001 | Schuster | |
| 6,208,407 B1 | 3/2001 | Loopstra | |
| 6,211,944 B1 | 4/2001 | Shiraishi | |
| 6,229,647 B1 | 5/2001 | Takahashi et al. | |
| 6,233,041 B1 | 5/2001 | Shiraishi | |
| 6,252,712 B1 | 6/2001 | Fürter et al. | |
| 6,259,512 B1 | 7/2001 | Mizouchi | |
| 6,341,007 B1 | 1/2002 | Nishi et al. | |
| 6,361,909 B1 | 3/2002 | Gau et al. | |
| 6,392,800 B2 | 5/2002 | Schuster | |
| 6,400,441 B1 | 6/2002 | Nishi et al. | |
| 6,404,482 B1 | 6/2002 | Shiraishi | |
| 6,452,662 B2 | 9/2002 | Mulkens et al. | |
| 6,483,573 B1 | 11/2002 | Schuster | |
| 6,535,273 B1 | 3/2003 | Maul | |
| 6,538,247 B2 | 3/2003 | Iizuka | |
| 6,549,269 B1 | 4/2003 | Nishi et al. | |
| 6,583,931 B2 | 6/2003 | Hiraiwa et al. | |
| 6,590,634 B1 | 7/2003 | Nishi et al. | |
| 6,597,430 B1 | 7/2003 | Nishi et al. | |
| 6,597,498 B1 * | 7/2003 | Schuster | 359/350 |
| 6,636,295 B2 | 10/2003 | Shiozawa | |
| 6,674,514 B2 | 1/2004 | Shinoda | |
| 6,680,798 B2 | 1/2004 | Kreuzer | |
| 6,710,855 B2 | 3/2004 | Shiraishi | |
| 6,769,273 B1 | 8/2004 | Nakagawa et al. | |
| 6,774,984 B2 | 8/2004 | Gerhard | |
| 6,842,223 B2 | 1/2005 | Tyminski | |
| 6,856,379 B2 | 2/2005 | Schuster | |
| 6,870,668 B2 | 3/2005 | Ozawa | |
| 6,885,493 B2 | 4/2005 | Ljungblad et al. | |
| 6,891,655 B2 | 5/2005 | Grebinski et al. | |
| 6,900,915 B2 | 5/2005 | Nanjyo et al. | |
| 6,913,373 B2 | 7/2005 | Tanaka et al. | |
| 6,970,233 B2 | 11/2005 | Blatchford | |
| 6,999,157 B2 | 2/2006 | Kohno | |
| 7,038,763 B2 | 5/2006 | Mulder et al. | |
| 7,095,546 B2 | 8/2006 | Mala et al. | |
| 7,145,720 B2 | 12/2006 | Krähmer et al. | |
| 7,239,446 B2 | 7/2007 | Kreuzer | |
| 7,245,353 B2 | 7/2007 | Mulkens et al. | |
| 7,245,355 B2 | 7/2007 | Mulkens et al. | |
| 7,345,740 B2 | 3/2008 | Wagner et al. | |
| 7,408,616 B2 | 8/2008 | Gruner et al. | |
| 7,433,046 B2 | 10/2008 | Everett et al. | |
| 7,446,858 B2 | 11/2008 | Kudo et al. | |
| 2001/0012154 A1 | 8/2001 | Schuster | |
| 2001/0019404 A1 | 9/2001 | Schuster et al. | |
| 2001/0035942 A1 | 11/2001 | Hara et al. | |
| 2001/0052968 A1 | 12/2001 | Shiozawa | |
| 2002/0024008 A1 | 2/2002 | Iizuka | |
| 2002/0027719 A1 | 3/2002 | Kreuzer | |
| 2002/0085176 A1 | 7/2002 | Hiraiwa et al. | |
| 2002/0085276 A1 | 7/2002 | Tanitsu et al. | |
| 2002/0101572 A1 | 8/2002 | Shiraishi | |
| 2002/0126380 A1 | 9/2002 | Schuster | |
| 2002/0152452 A1 | 10/2002 | Socha | |
| 2002/0176166 A1 | 11/2002 | Schuster | |
| 2002/0177048 A1 | 11/2002 | Saitoh et al. | |
| 2002/0177054 A1 | 11/2002 | Saitoh et al. | |
| 2002/0186462 A1 | 12/2002 | Gerhard | |
| 2002/0191288 A1 | 12/2002 | Gruner et al. | |
| 2002/0196416 A1 | 12/2002 | Shiraishi | |
| 2003/0007158 A1 | 1/2003 | Hill | |
| 2003/0038225 A1 | 2/2003 | Mulder et al. | |
| 2003/0043356 A1 | 3/2003 | Shiraishi | |
| 2003/0053036 A1 | 3/2003 | Fujishima et al. | |
| 2003/0160949 A1 | 8/2003 | Komatsuda et al. | |
| 2003/0168597 A1 * | 9/2003 | Webb et al. | 250/330 |
| 2003/0206289 A1 | 11/2003 | Matsuyama | |
| 2004/0004771 A1 | 1/2004 | Omura | |
| 2004/0012764 A1 | 1/2004 | Mulder et al. | |
| 2004/0057036 A1 | 3/2004 | Kawashima et al. | |
| 2004/0104654 A1 | 6/2004 | Lee et al. | |
| 2004/0119954 A1 | 6/2004 | Kawashima et al. | |
| 2004/0120044 A1 | 6/2004 | Kreuzer | |
| 2004/0169924 A1 | 9/2004 | Flagello et al. | |
| 2004/0184019 A1 | 9/2004 | Totzeck et al. | |
| 2004/0227923 A1 | 11/2004 | Flagello et al. | |
| 2004/0240073 A1 | 12/2004 | Gerhard | |
| 2005/0094268 A1 | 5/2005 | Fiolka et al. | |
| 2005/0095749 A1 | 5/2005 | Krellmann et al. | |
| 2005/0146704 A1 | 7/2005 | Gruner et al. | |
| 2005/0237527 A1 | 10/2005 | Mori | |
| 2005/0264885 A1 | 12/2005 | Albert | |
| 2005/0270608 A1 | 12/2005 | Shiozawa et al. | |
| 2006/0012769 A1 | 1/2006 | Suzuki | |
| 2006/0055834 A1 | 3/2006 | Tanitsu et al. | |
| 2006/0072095 A1 | 4/2006 | Kudo et al. | |
| 2006/0077370 A1 | 4/2006 | Mulkens et al. | |
| 2006/0092398 A1 | 5/2006 | McCarthy | |
| 2006/0132748 A1 | 6/2006 | Fukuhara | |
| 2006/0139611 A1 | 6/2006 | Wagner et al. | |
| 2006/0146384 A1 | 7/2006 | Schultz et al. | |
| 2006/0158624 A1 | 7/2006 | Toyoda | |
| 2006/0164711 A1 | 7/2006 | Govil et al. | |
| 2006/0170901 A1 | 8/2006 | Tanitsu et al. | |
| 2006/0203214 A1 | 9/2006 | Shiraishi | |
| 2006/0291057 A1 | 12/2006 | Fiolka et al. | |
| 2007/0008511 A1 | 1/2007 | De Boeij et al. | |
| 2007/0019179 A1 | 1/2007 | Fiolka et al. | |
| 2007/0058151 A1 | 3/2007 | Eurlings et al. | |
| 2007/0081114 A1 | 4/2007 | Fiolka et al. | |
| 2007/0146676 A1 | 6/2007 | Tanitsu et al. | |
| 2007/0183017 A1 | 8/2007 | Hembd | |
| 2007/0188730 A1 | 8/2007 | Takeuchi et al. | |
| 2007/0263199 A1 | 11/2007 | Fiolka et al. | |
| 2007/0296936 A1 | 12/2007 | Kato et al. | |
| 2007/0296941 A1 | 12/2007 | Omura | |
| 2008/0024747 A1 | 1/2008 | Kudo et al. | |
| 2008/0030706 A1 | 2/2008 | Yamamoto | |
| 2008/0030707 A1 | 2/2008 | Tanaka et al. | |
| 2008/0068572 A1 | 3/2008 | Kudo et al. | |
| 2008/0316459 A1 | 12/2008 | Fiolka et al. | |
| 2008/0316598 A1 | 12/2008 | Fiolka et al. | |
| 2009/0002675 A1 | 1/2009 | Fiolka et al. | |
| 2009/0040610 A1 | 2/2009 | Stallinga et al. | |
| 2009/0073411 A1 | 3/2009 | Tanitsu | |
| 2009/0073414 A1 | 3/2009 | Tanitsu et al. | |
| 2009/0073441 A1 | 3/2009 | Tanitsu et al. | |
| 2009/0091730 A1 | 4/2009 | Tanaka | |
| 2009/0097007 A1 | 4/2009 | Tanaka | |
| 2009/0109417 A1 | 4/2009 | Tanitsu | |
| 2009/0116093 A1 | 5/2009 | Tanitsu | |
| 2009/0122292 A1 | 5/2009 | Shiraishi | |
| 2009/0128886 A1 | 5/2009 | Hirota | |
| 2009/0147233 A1 | 6/2009 | Toyoda | |
| 2009/0147234 A1 | 6/2009 | Toyoda | |
| 2009/0147235 A1 | 6/2009 | Toyoda | |
| 2009/0185154 A1 | 7/2009 | Tanitsu | |
| 2009/0185156 A1 | 7/2009 | Kudo et al. | |
| 2009/0284729 A1 | 11/2009 | Shiraishi | |
| 2009/0316132 A1 | 12/2009 | Tanitsu et al. | |
| 2009/0323041 A1 | 12/2009 | Toyoda | |
| 2010/0141926 A1 | 6/2010 | Omura | |
| 2010/0142051 A1 | 6/2010 | Omura | |

FOREIGN PATENT DOCUMENTS

| | | |
|---|---|---|
| EP | 0 744 664 A2 | 11/1996 |
| EP | 0 764 858 A2 | 3/1997 |
| EP | 0 779 530 A1 | 6/1997 |

| | | |
|---|---|---|
| EP | 0 937 999 A1 | 8/1999 |
| EP | 1 260 849 A1 | 11/2002 |
| EP | 1 577 709 A2 | 9/2005 |
| EP | 1 681 710 A1 | 7/2006 |
| EP | 1 840 945 A1 | 10/2007 |
| EP | 1 953 805 A1 | 8/2008 |
| GB | 856621 | 12/1960 |
| JP | A-61-091662 | 5/1986 |
| JP | A-62-265722 | 11/1987 |
| JP | A-02-285320 | 11/1990 |
| JP | A-04-101148 | 4/1992 |
| JP | A-04-225357 | 8/1992 |
| JP | A-05-090128 | 4/1993 |
| JP | A-05-109601 | 4/1993 |
| JP | A-05-283317 | 10/1993 |
| JP | A-05-326370 | 12/1993 |
| JP | A-06-53120 | 2/1994 |
| JP | A-06-124872 | 5/1994 |
| JP | A-06-124873 | 5/1994 |
| JP | A-06-188169 | 7/1994 |
| JP | A-06-196388 | 7/1994 |
| JP | A-06-204121 | 7/1994 |
| JP | A-06-244082 | 9/1994 |
| JP | A-06-281869 | 10/1994 |
| JP | A-07-183201 | 7/1995 |
| JP | A-07-201723 | 8/1995 |
| JP | A-07-263315 | 10/1995 |
| JP | A-07-283119 | 10/1995 |
| JP | A-07-307268 | 11/1995 |
| JP | A-09-160219 | 6/1997 |
| JP | A-09-184918 | 7/1997 |
| JP | A-09-219358 | 8/1997 |
| JP | A-10-503300 | 3/1998 |
| JP | A-10-104427 | 4/1998 |
| JP | A-10-303114 | 11/1998 |
| JP | A-11-54426 | 2/1999 |
| JP | A-2000-114157 | 4/2000 |
| JP | A-2001-272764 | 10/2001 |
| JP | A-2001-274083 | 10/2001 |
| JP | B2-3246615 | 1/2002 |
| JP | A-2002-075816 | 3/2002 |
| JP | A-2002-075835 | 3/2002 |
| JP | A-2002-231619 | 8/2002 |
| JP | A-2002-324743 | 11/2002 |
| JP | A-2002-334836 | 11/2002 |
| JP | A-2003-035822 | 2/2003 |
| JP | A-2003-059821 | 2/2003 |
| JP | A-2003-068600 | 3/2003 |
| JP | A-2003-297727 | 10/2003 |
| JP | A-2003-532281 | 10/2003 |
| JP | A-2004-051717 | 2/2004 |
| JP | A-2004-078136 | 3/2004 |
| JP | A-2004-087987 | 3/2004 |
| JP | A-2004-104654 | 4/2004 |
| JP | A-2004-179172 | 6/2004 |
| JP | A-2004-520618 | 7/2004 |
| JP | A-2004-258670 | 9/2004 |
| JP | A-2004-304135 | 10/2004 |
| JP | A-2005-005521 | 1/2005 |
| JP | A-2005-012190 | 1/2005 |
| JP | A-2005-093522 | 4/2005 |
| JP | A-2005-108925 | 4/2005 |
| JP | A-2005-166871 | 6/2005 |
| JP | A-2005-524112 | 8/2005 |
| JP | A-2005-236088 | 9/2005 |
| JP | A-2005-302826 | 10/2005 |
| JP | A-2006-019702 | 1/2006 |
| JP | A-2006-113437 | 4/2006 |
| JP | A-2006-513442 | 4/2006 |
| JP | A-2006-177865 | 7/2006 |
| JP | A-2006-524349 | 10/2006 |
| JP | A-2010-514716 | 5/2010 |
| KR | 10-1997-0016641 A | 4/1997 |
| KR | 2001-53240 A | 8/1999 |
| KR | 2002-0042462 A | 6/2002 |
| KR | 10-0474578 B1 | 6/2005 |
| WO | WO 97/11411 A1 | 3/1997 |
| WO | WO 99/49504 | 9/1999 |
| WO | WO 00/02092 | 1/2000 |
| WO | WO 00/67303 A1 | 11/2000 |
| WO | WO 01/81977 A2 | 11/2001 |
| WO | WO 02/093209 A2 | 11/2002 |
| WO | WO 2004/051717 A1 | 6/2004 |
| WO | WO 2004/104654 A1 | 12/2004 |
| WO | WO 2005/027207 A1 | 3/2005 |
| WO | WO 2005/031467 A2 | 4/2005 |
| WO | WO 2005/036619 A1 | 4/2005 |
| WO | WO 2005/041277 A1 | 5/2005 |
| WO | WO 2005/050718 A1 | 6/2005 |
| WO | WO 2005059645 A2 * | 6/2005 |
| WO | WO 2005/069081 A2 | 7/2005 |
| WO | WO 2005/076045 A2 | 8/2005 |
| WO | WO 2006/008691 A1 | 1/2006 |
| WO | WO 2006/080285 A1 | 8/2006 |
| WO | WO 2007/055120 A1 | 5/2007 |
| WO | WO 2008/074673 A2 | 6/2008 |

OTHER PUBLICATIONS

Sep. 27, 2010 Office Action issued in U.S. Appl. No. 10/587,254.
Dec. 1, 2009 Office Action issued in U.S. Appl. No. 11/902,277.
Jun. 25, 2008 Office Action issued in U.S. Appl. No. 11/902,277.
Apr. 15, 2009 Office Action issued in U.S. Appl. No. 11/902,277.
Jun. 25, 2008 Office Action issued in U.S. Appl. No. 11/902,282.
Feb. 9, 2009 Office Action issued in U.S. Appl. No. 11/902,282.
Dec. 14, 2009 Office Action issued in U.S. Appl. No. 11/902,282.
Jan. 25, 2010 Search Report issued in European Application No. 09015058.2.
Tsuruta, T. "Applied Optics II," Baifukan Co., Ltd. pp. 166-167, Jul. 1990 (with translation).
Nov. 6, 2009 Office Action issued in Chinese Application No. 2008102114957 (with translation).
Sep. 11, 2009 Office Action issued in Chinese Application No. 2008102114976 (with translation).
"High NA Lithographic Imagery at Brewster's Angle" Brunner, Timothy A., et al., Proceedings of SPIE (U.S.A.), vol. 4691, pp. 1-24, 2002.
Mar. 21, 2008 Office Action issued in Chinese Application No. 2004800341246 (with translation).
Oct. 29, 2009 Office Action issued in U.S. Appl. No. 12/289,515.
Feb. 26, 2009 Office Action in U.S. Appl. No. 11/347,421.
Jan. 7, 2010 Office Action issued in U.S. Appl. No. 12/289,518.
Apr. 21, 2010 Office Action issued in U.S. Appl. No. 12/289,518.
Jan. 8, 2009 Office Action issued in U.S. Appl. No. 11/410,952.
Nov. 25, 2009 Office Action issued in U.S. Appl. No. 11/410,952.
Jun. 16, 2010 Office Action issued in U.S. Appl. No. 11/410,952.
Apr. 24, 2009 Office Action issued in Chinese Application No. 2006800006868 (with translation).
Jan. 28, 2010 Search Report issued in European Application No. 06711853.9.
Apr. 22, 2010 Office Action issued in Japanese Application No. 2006-553907 (with translation).
Mar. 26, 2010 Office Action issued in U.S. Appl. No. 11/902,277.
Mar. 26, 2010 Office Action issued in U.S. Appl. No. 11/902,282.
Jan. 6, 2011 Office Action issued in U.S. Appl. No. 11/902,282.
Feb. 8, 2011 Office Action issued in U.S. Appl. No. 12/320,465.
Jan. 24, 2011 Office Action issued in Korean Application No. 2009-7010158 (with translation).
Jan. 24, 2011 Office Action issued in Korean Application No. 2005-7018973 (with translation).
Oct. 18, 2010 Office Action issued in U.S. Appl. No. 12/382,277.
Jan. 25, 2011 Office Action issued in Korean Application No. 2009-7010159 (with translation).
Feb. 1, 2011 Office Action issued in Chinese Application No. 200810126659.6 (with translation).
Feb. 1, 2011 Notice of Reasons for Rejection issued in Japanese Application No. 2006-262588 (with translation).
Feb. 1, 2011 Notice of Reasons for Rejection issued in Japanese Application No. 2006-262590 (with translation).
Feb. 1, 2011 Notice of Reasons for Rejection issued in Japanese Application No. 2005-517637 (with translation).
Nov. 30, 2010 Notice of Allowance issued in Korean Application No. 10-2008-7019082.

Jan. 14, 2011 Office Action issued in U.S. Appl. No. 12/320,480.
Jan. 14, 2011 Office Action issued in U.S. Appl. No. 12/320,468.
Nov. 30, 2010 Notice of Allowance issued in Korean Application No. 10-2008-7019081.
Dec. 7, 2010 Search Report issued in European Application No. 10012876.8.
Nov. 3, 2010 Search Report issued in European Application No. 09015058.2.
Jul. 20, 2010 Notice of Allowance issued in U.S. Appl. No. 12/289,515.
Aug. 3, 2010 Notice of Allowance issued in Japanese Application No. 2006-553907.
Nov. 12, 2010 Office Action issued in Chinese Application No. 200710110948.2 (with translation).
Oct. 8, 2010 Office Action issued in Chinese Application No. 200810126659.6 (with translation).
Oct. 26, 2010 Office Action issued in Japanese Application No. 2005-517637 (with translation).
Oct. 26, 2010 Office Action issued in Japanese Application No. 2006-262588 (with translation).
Oct. 26, 2010 Office Action issued in Japanese Application No. 2006-262590 (with translation).
Jul. 20, 2010 Office Action issued in Korean Application No. 10-2010-7008438 (with translation).
Jul. 20, 2010 Office Action issued in Korean Application No. 10-2010-7008441 (with translation).
Jul. 20, 2010 Office Action issued in Korean Application No. 10-2010-7008444 (with translation).
Oct. 4, 2010 Supplementary Search Report issued in European Application No. 05703646.9.
Aug. 23, 2010 Office Action issued in Chinese Application No. 200810211496.1 (with translation).
Sep. 20, 2010 Notice of Allowance issued in U.S. Appl. No. 11/410,952.
Sep. 29, 2010 Search Report issued in European Application No. 10174843.2.
English Translation of May 31, 2010 Korean Office Action issued in Application No. 10-2008-7019081.
English Translation of May 31, 2010 Korean Office Action issued in Application No. 10-2008-7019082.
Aug. 3, 2010 Office Action issued in Japanese Application No. 2005-515570 (with translation).
Feb. 15, 2011 Office Action issued in U.S. Appl. No. 11/902,277.
Jul. 3, 2008 Office Action issued in U.S. Appl. No. 11/319,057.
Feb. 26, 2009 Office Action issued in U.S. Appl. No. 11/319,057.
Jan. 14, 2011 Office Action issued in U.S. Appl. No. 12/461,852.
Oct. 4, 2010 International Search Report issued in International Application No. PCT/JP2010/061300.
Oct. 4, 2010 Written Opinion of the International Searching Authority issued in International Application No. PCT/JP2010/061300.
Jan. 11, 2011 Office Action issued in U.S. Appl. No. 12/461,801.
Aug. 3, 2010 Office Action issued in Japanese Application No. 2006-262589 (with translation).
Jul. 12, 2010 Office Action issued in U.S. Appl. No. 12/461,801.
Sep. 15, 2008 Office Action issued in U.S. Appl. No. 11/644,966.
Jun. 25, 2009 Office Action issued in U.S. Appl. No. 11/644,966.
Jan. 26, 2011 Office Action issued in Chinese Application No. 200910173715.6 (with translation).
Feb. 23, 2010 Office Action issued in Japanese Application No. 2006-262589 (with translation).
Feb. 23, 2010 Office Action issued in Japanese Application No. 2005-515570 (with translation).
May 14, 2008 International Preliminary Report on Patentability issued in International Application No. PCT/JP2006/321607.
May 14, 2008 Written Opinion issued in International Application No. PCT/JP2006/321607 (with translation).
Nov. 12, 2010 Office Action issued in Chinese Application No. 200910126047.1 (with translation).
Feb. 25, 2010 Extended Search Report issued in European Application No. 06822564.8.
U.S. Appl. No. 12/835,860, filed Jul. 14, 2010 by Kanayamaya et al.
Apr. 15, 2010 Office Action issued in U.S. Appl. No. 10/587,254.
Levinson, Harry J. Principles of Lithography, Bellingham, WA: SPIE Press, 2001. pp. 205-206.
Apr. 1, 2011 Notice of Allowance issued in U.S. Appl. No. 10/587,254.
Jun. 5, 2012 Office Action issued in U.S. Appl. No. 12/656,636.
Oct. 16, 2012 Office Action issued in U.S. Appl. No. 12/656,636.

* cited by examiner (a)

(b)

(a)

(b)

(a)

(b)

OPTICAL SYSTEM, EXPOSURE SYSTEM, AND EXPOSURE METHOD

CROSS-REFERENCE TO RELATED APPLICATIONS

This is a Divisional of U.S. patent application Ser. No. 10/587,254 filed on Jun. 1, 2007, which is hereby incorporated by reference in its entirety. This application is based upon and claims the benefit of priorities from International Application No. PCT/JP2005/000406 filed on Jan. 14, 2005, Japanese Patent Application No. 2004-018226 filed on Jan. 27, 2004, and Japanese Patent Application No. 2004-338749 filed on Nov. 24, 2004 the entire contents of which are incorporated herein by reference.

BACKGROUND

1. Field

One embodiment of the present invention relates to an optical system, exposure apparatus, and exposure method and, more particularly, to an exposure apparatus for fabricating micro devices, such as semiconductor elements, image pickup devices, liquid-crystal display devices, and thin-film magnetic heads, for example, by lithography.

2. Description of the Related Art

In the typical exposure apparatus of this type, a light beam emitted from a light source is guided through a fly's eye lens as an optical integrator to form a secondary light source as a substantive surface illuminant consisting of a lot of light sources. A light beam from the secondary light source is guided through an aperture stop disposed in the vicinity of the rear focal plane of the fly's eye lens, to be limited, and then is incident to a condenser lens.

The light beam condensed by the condenser lens illuminates a mask with a predetermined pattern therein, in a superposed manner. Light transmitted by the pattern of the mask travels through a projection optical system to be focused on a wafer. In this manner the mask pattern is projected (or transferred) onto the wafer to effect exposure thereof. The pattern formed in the mask is of high integration and a high-contrast pattern image must be formed on the wafer in order to accurately transfer the microscopic pattern onto the wafer.

Japanese Patent Application Laid-Open No. 5-90128 proposed technology of obtaining the high-contrast image of the microscopic pattern on the wafer, for example, by setting a polarization state of exposure light to linear polarization of circumferential vibration (hereinafter referred to as "azimuthal (circumferential) polarization state") in a lens aperture (pupil plane) of the projection optical system.

DISCLOSURE OF THE INVENTION

Problem to be Solved by the Invention

SUMMARY

An embodiment of the present invention provides an optical system capable of achieving a substantially azimuthal polarization state in the lens aperture while suppressing the loss of light quantity, based on a simple configuration. Another embodiment of the present invention provides an exposure apparatus and exposure method capable of forming a high-contrast image of a microscopic pattern of a mask on a photosensitive substrate to effect high-throughput and faithful exposure, using an optical system capable of achieving a substantially azimuthal polarization state in the lens aperture while suppressing the loss of light quantity.

For purposes of summarizing the invention, certain aspects, advantages, and novel features of the invention have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessary achieving other advantages as may be taught or suggested herein.

The optical system in accordance with an embodiment of the present invention is an optical system comprising a birefringent element for achieving a substantially circumferential distribution or a substantially radial distribution as a fast axis distribution in a lens aperture; and an optical rotator disposed behind the birefringent element and adapted to rotate a polarization state in the lens aperture.

The optical system in accordance with another embodiment of the present invention is an optical system comprising:

a birefringent optical rotator which is made of an optical material with linear birefringence and optical rotatory power and an optic axis of which is arranged substantially in parallel with an optical axis of the optical system, wherein a light beam in a substantially circular polarization state is incident to the birefringent optical rotator.

The exposure apparatus in accordance with an embodiment of the present invention is an exposure apparatus comprising the optical system of the one of the embodiments, wherein a pattern of a mask is projected through the optical system onto a photosensitive substrate to effect exposure thereof.

The exposure method in accordance with an embodiment of the present invention is an exposure method of projecting a pattern formed in a mask, through the optical system of one of the embodiments onto a photosensitive substrate to effect exposure thereof.

DESCRIPTION OF THE EMBODIMENTS

Figure 1:
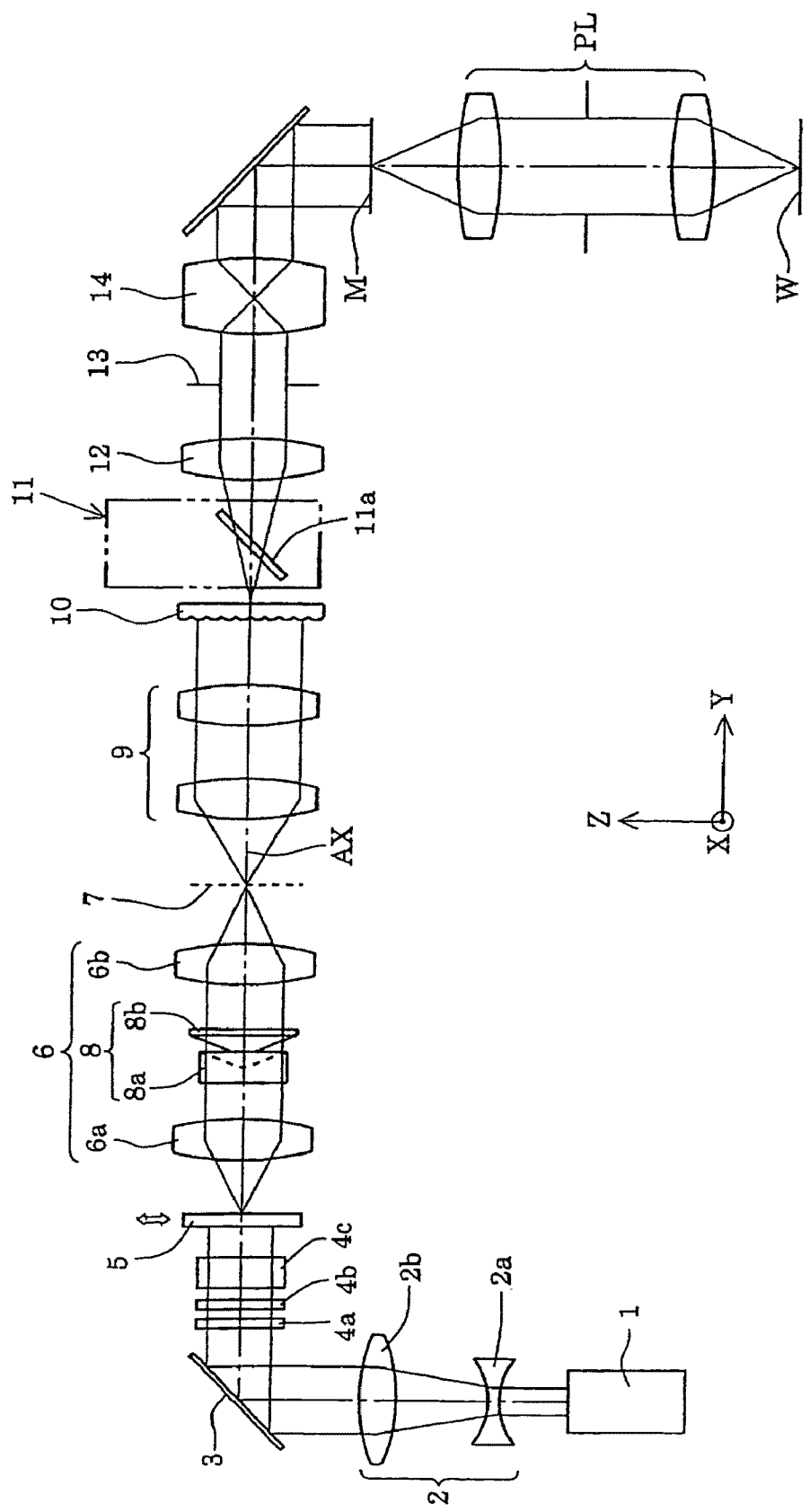
FIG. 1 is a drawing schematically showing a configuration of an exposure apparatus according to an embodiment of the present invention.

Embodiments of the present invention will be described based on the accompanying drawings. FIG. 1 is a drawing schematically showing a configuration of an exposure apparatus according to an embodiment of the present invention. In FIG. 1, the Z-axis is set along a direction of a normal to a wafer W being a photosensitive substrate, the Y-axis along a direction parallel to the plane of FIG. 1 in the plane of the wafer W, and the X-axis along a direction normal to the plane of FIG. 1 in the plane of the wafer W. With reference to FIG. 1, the exposure apparatus of the present embodiment is provided with a light source 1 for supplying exposure light (illumination light).

The light source 1 can be, for example, a KrF excimer laser light source for supplying light of wavelength of 248 nm or an ArF excimer laser light source for supplying light of wavelength of 193 nm. A nearly parallel light beam emitted along the Z-direction from the light source 1 has a rectangular cross section extending oblongly along the X-direction, and is incident to a beam expander 2 consisting of a pair of lenses 2a and 2b. The lenses 2a and 2b have a negative refracting power and a positive refracting power, respectively, in the plane of FIG. 1 (YZ plane). Therefore, the light beam incident to the beam expander 2 is expanded in the plane of FIG. 1 to be shaped into a light beam having a cross section of a predetermined rectangular shape.

The nearly parallel light beam having passed through the beam expander 2 as a shaping optical system is deflected into the Y-direction by a bending mirror 3, then travels through a quarter-wave plate 4a, a half-wave plate 4b, a depolarizer (depolarizing element) 4c, and a diffractive optical element 5 for annular illumination, and then is incident to an afocal lens 6. The quarter-wave plate 4a, half-wave plate 4b, and depolarizer 4c herein constitute a polarization state converter 4, as described later. The afocal lens 6 is an afocal system (afocal optical system) the front focal point of which agrees approximately with the position of the diffractive optical element 5 and the rear focal point of which agrees approximately with a position of a predetermined plane 7 indicated by a dashed line in the drawing.

In general, a diffractive optical element is constructed by forming steps with a pitch approximately equal to the wavelength of exposure light (illumination light), in a substrate, and has an action to diffract an incident beam into desired angles. Specifically, the diffractive optical element 5 for annular illumination has the following function: when a parallel light beam having a rectangular cross section is incident thereto, it forms an optical intensity distribution of an annular shape in its far field (or Fraunhofer diffraction region).

Therefore, the nearly parallel light beam incident to the diffractive optical element 5 as a light beam converter forms an optical intensity distribution of an annular shape on the pupil plane of the afocal lens 6 and then emerges as a nearly parallel light beam from the afocal lens 6. A conical axicon system 8 is located at or near the pupil plane in an optical path between front lens unit 6a and rear lens unit 6b of the afocal lens 6, and its detailed configuration and action will be described later. For simplifying the description, the basic configuration and action will be described below in disregard for the action of conical axicon system 8.

The light beam having passed through the afocal lens 6 travels through a zoom lens 9 for variation of σ-value and then is incident to a micro fly's eye lens (or fly's eye lens) 10 as an optical integrator. The micro fly's eye lens 10 is an optical element consisting of a lot of microlenses with a positive refracting power arranged vertically and horizontally and densely. In general, a micro fly's eye lens is constructed, for example, by etching a plane-parallel plate so as to form a microlens group.

It is noted herein that each microlens forming the micro fly's eye lens is smaller than each lens element forming a fly's eye lens. The micro fly's eye lens is one in which a lot of microlenses (micro refracting surfaces) are integrally formed without being isolated from each other, different from the fly's eye lens consisting of lens elements isolated from each other. However, the micro fly's eye lens is also an optical integrator of the same wavefront splitting type as the fly's eye lens in term of the vertical and horizontal arrangement of the lens elements with the positive refracting power.

The position of the predetermined plane 7 is defined near the front focal position of the zoom lens 9 and the incidence surface of the micro fly's eye lens 10 is defined near the rear focal position of the zoom lens 9. In other words, the zoom lens 9 keeps the predetermined plane 7 and the incidence surface of the micro fly's eye lens 10 substantially in the relation of Fourier transform and, consequently, keeps the pupil plane of the afocal lens 6 optically nearly conjugate with the incidence surface of the micro fly's eye lens 10.

Therefore, for example, an illumination field of an annular shape around the optical axis AX, similar to that on the pupil plane of the afocal lens 6, is formed on the incidence surface of the micro fly's eye lens 10. The entire shape of this annular illumination field similarly varies depending upon the focal length of the zoom lens 9. Each microlens forming the micro fly's eye lens 10 has a rectangular cross section similar to a shape of an illumination field to be formed on a mask M (i.e., eventually, a shape of an exposure region to be formed on a wafer W).

The light beam incident to the micro fly's eye lens 10 is two-dimensionally split by a lot of microlenses to form a secondary light source having an optical intensity distribution approximately equal to the illumination field formed by the incident light beam, i.e., a secondary light source of a substantive surface illuminant of an annular shape around the optical axis AX, on the rear focal plane (consequently, on the illumination pupil). A light beam from the secondary light source formed on the rear focal plane of the micro fly's eye lens 10 travels through beam splitter 11a and condenser optical system 12 to illuminate a mask blind 13 in a superposed manner.

In this manner, an illumination field of a rectangular shape according to the shape and the focal length of each microlens forming the micro fly's eye lens 10 is formed on the mask blind 13 as an illumination field stop. An internal configuration and action of a polarization monitor 11 incorporating the beam splitter 11a will be described later. A light beam having passed through an aperture (light transmitting part) of a rectangular shape of the mask blind 13 is subjected to focusing action of an imaging optical system 14 and thereafter illuminates the mask M with a predetermined pattern therein, in a superposed and approximately telecentric manner.

Namely, the imaging optical system 14 foams an image of the rectangular aperture of the mask blind 13 on the mask M. A light beam having passed through the pattern of the mask M then travels through a projection optical system PL which is approximately telecentric both on the object side and on the image side, to form an image of the mask pattern on a wafer W being a photosensitive substrate. While the wafer W is two-dimensionally driven and controlled in the plane (XY plane) perpendicular to the optical axis AX of the projection optical system PL, one-shot exposure or scan exposure is effected so that the pattern of the mask M sequentially exposed into each of exposure regions on the wafer W.

In the polarization state converter 4, the quarter-wave plate 4a is arranged so that the crystallographic axis thereof is rotatable around the optical axis AX, and converts incident light of elliptic polarization into light of linear polarization. The half-wave plate 4b is arranged so that the crystallographic axis thereof is rotatable around the optical axis AX, and changes the plane of polarization of incident linearly polarized light. The depolarizer 4c is composed of a rock crystal prism of wedge shape (not shown) and a silica prism of wedge shape (not shown) having complementary shapes. The rock crystal prism and the silica prism are constructed as an integral prism assembly so as to be freely inserted into or retracted from the illumination optical path.

Where the light source 1 is a KrF excimer laser light source or an ArF excimer laser light source, light emitted from these light sources typically has the degree of polarization of not less than 95% and nearly linearly polarized light is incident to the quarter-wave plate 4a. However, if a right-angle prism is interposed as a back reflector in the optical path between the light source 1 and the polarization state converter 4, total reflection in the right-angle prism will convert linear polarization into elliptic polarization unless the plane of polarization of the incident linearly polarized light coincides with the p-polarization plane or s-polarization plane.

In the polarization state converter 4, for example, even if light of elliptic polarization is incident because of the total reflection in the right-angle prism, it will be converted into light of linear polarization by the action of the quarter-wave plate 4a and the linearly polarized light will be incident to the half-wave plate 4b. When the crystallographic axis of the half-wave plate 4b is set at an angle of 0° or 90° relative to the plane of polarization of incident linearly polarized light, the light of linear polarization incident to the half-wave plate 4b passes directly without change in the plane of polarization.

When the crystallographic axis of the half-wave plate 4b is set at an angle of 45° relative to the plane of polarization of incident linearly polarized light, the light of linear polarization incident to the half-wave plate 4b is converted into light of linear polarization with the plane of polarization changed by 9°. Furthermore, when the crystallographic axis of the rock crystal prism of the depolarizer 4c is set at an angle of 45° relative to the plane of polarization of incident linearly polarized light, the light of linear polarization incident to the rock crystal prism is converted (or depolarized) into light in an unpolarized state.

The polarization state converter 4 is arranged so that the crystallographic axis of the rock crystal prism makes the angle of 45° relative to the plane of polarization of incident linearly polarized light when the depolarizer 4c is positioned in the illumination optical path. Incidentally, if the crystallographic axis of the rock crystal prism is set at an angle of 0° or 90° relative to the plane of polarization of incident linearly polarized light, the light of linear polarization incident to the rock crystal prism will pass directly without change in the plane of polarization. When the crystallographic axis of the half-wave plate 4b is set at an angle of 22.5° relative to the plane of polarization of incident linearly polarized light, the light of linear polarization incident to the half-wave plate 4b is converted into light in an unpolarized state including a linear polarization component passing without change in the plane of polarization, and a linear polarization component with the plane of polarization changed by 90°.

In the polarization state converter 4, as described above, the light of linear polarization is incident to the half-wave plate 4b, and let us assume herein that light of linear polarization with the polarization direction (the direction of the electric field) along the Z-direction in FIG. 1 (which will be referred to hereinafter as "Z-directional polarization") is incident to the half-wave plate 4b, for simplification of the description hereinafter. When the depolarizer 4c is positioned in the illumination optical path and when the crystallographic axis of the half-wave plate 4b is set at the angle of 0° or 90° relative to the plane of polarization (direction of polarization) of incident Z-directionally polarized light, the light of Z-directional polarization incident to the half-wave plate 4b passes as Z-directionally polarized light without change in the plane of polarization and then is incident to the rock crystal prism of the depolarizer 4c. Since the crystallographic axis of the rock crystal prism is set at the angle of 45° relative to the plane of polarization of the incident Z-directionally polarized light, the light of Z-directional polarization incident to the rock crystal prism is converted into light in an unpolarized state.

The light depolarized through the rock crystal prism travels through the silica prism as a compensator for compensating the traveling direction of light, and is then incident in an unpolarized state, into the diffractive optical element 5. On the other hand, when the crystallographic axis of the half-wave plate 4b is set at the angle of 45° relative to the plane of polarization of the incident Z-directionally polarized light, the light of Z-directional polarization incident to the half-wave plate 4b is converted into light with the plane of polarization changed by 90°, i.e., light of linear polarization having the direction of polarization (direction of the electric field) along the X-direction in FIG. 1 (which will be referred to hereinafter as "X-directional polarization") to be incident to the rock crystal prism of the depolarizer 4c. Since the crystallographic axis of the rock crystal prism is also set at the angle of 45° relative to the plane of polarization of the incident X-directionally polarized light, the light of the X-directional polarization incident to the rock crystal prism is converted into light in an unpolarized state to travel through the silica prism and then to be incident in an unpolarized state to the diffractive optical element 5.

In contrast to it, when the depolarizer 4c is retracted from the illumination optical path and when the crystallographic axis of the half-wave plate 4b is set at the angle of 0° or 90° relative to the plane of polarization of the incident Z-directionally polarized light, the light of Z-directional polarization incident to the half-wave plate 4b passes as Z-directionally polarized light without change in the plane of polarization, and is incident in a Z-directional polarization state to the diffractive optical element 5. On the other hand, when the crystallographic axis of the half-wave plate 4b is set at the angle of 45° relative to the plane of polarization of the incident Z-directionally polarized light, the light of Z-directional polarization incident to the half-wave plate 4b is converted into light of X-directional polarization with the plane of polarization changed by 90°, and is incident in an X-directional polarization state to the diffractive optical element 5.

As described above, the polarization state converter 4 is able to make the light in an unpolarized state incident to the diffractive optical element 5 when the depolarizer 4c is inserted and positioned in the illumination optical path. It is also able to make the light in a Z-directional polarization state incident to the diffractive optical element 5 when the depolarizer 4c is retracted from the illumination optical path and when the crystallographic axis of the half-wave plate 4b is set at the angel of 0° or 90° relative to the plane of polarization of the incident Z-directionally polarized light. Furthermore, it is also able to make the light in an X-directional polarization state incident to the diffractive optical element 5 when the depolarizer 4c is retracted from the illumination optical path and when the crystallographic axis of the half-wave plate 4b is set at the angel of 45° relative to the plane of polarization of the incident Z-directionally polarized light.

In other words, the polarization state converter 4 is able to switch the polarization state of incident light to the diffractive optical element 5 (consequently, the polarization state of light to illuminate the mask M and wafer W) between a linear polarization state and an unpolarized state and, in the case of the linear polarization state, it is able to switch the polarization of incident light between polarization states orthogonal to each other (i.e., between Z-directional polarization and X-directional polarization), through the action of the polarization state converter consisting of the quarter-wave plate 4a, half-wave plate 4b, and depolarizer 4c.

Furthermore, the polarization state converter 4 is able to make light in a circular polarization state incident to the diffractive optical element 5 (consequently, to after-described birefringent element 21) when the half-wave plate 4b and depolarizer 4c both are retracted from the illumination optical path and when the crystallographic axis of the quarter-wave plate 4a is set at a predetermined angle relative to incident elliptically polarized light.

The conical axicon system 8 is composed of a first prism member 8a a plane of which faces the light source side and a refracting surface of a concave conical shape of which faces the mask side, and a second prism member 8b a plane of which faces the mask side and a refracting surface of a convex conical shape of which faces the light source side, in order from the light source side. Then the refracting surface of the concave conical shape of the first prism member 8a and the refracting surface of the convex conical shape of the second prism member 8b are formed in such complementary shapes as to be able to butt each other. At least one of the first prism member 8a and the second prism member 8b is arranged movable along the optical axis AX to vary the distance between the refracting surface of the concave conical shape of the first prism member 8a and the refracting surface of the convex conical shape of the second prism member 8b.

In a state in which the refracting surface of the concave conical shape of the first prism member 8a butts against the refracting surface of the convex conical shape of the second prism member 8b, the conical axicon system 8 functions as a plane-parallel plate and has no effect on the secondary light source of annular shape formed. However, when the refracting surface of the concave conical shape of the first prism member 8a is located apart from the refracting surface of the convex conical shape of the second prism member 8b, the conical axicon system 8 functions as a so-called beam expander. Therefore, the angle of the incident light beam to the predetermined plane 7 varies with change in the distance of the conical axicon system 8.

Figure 2:
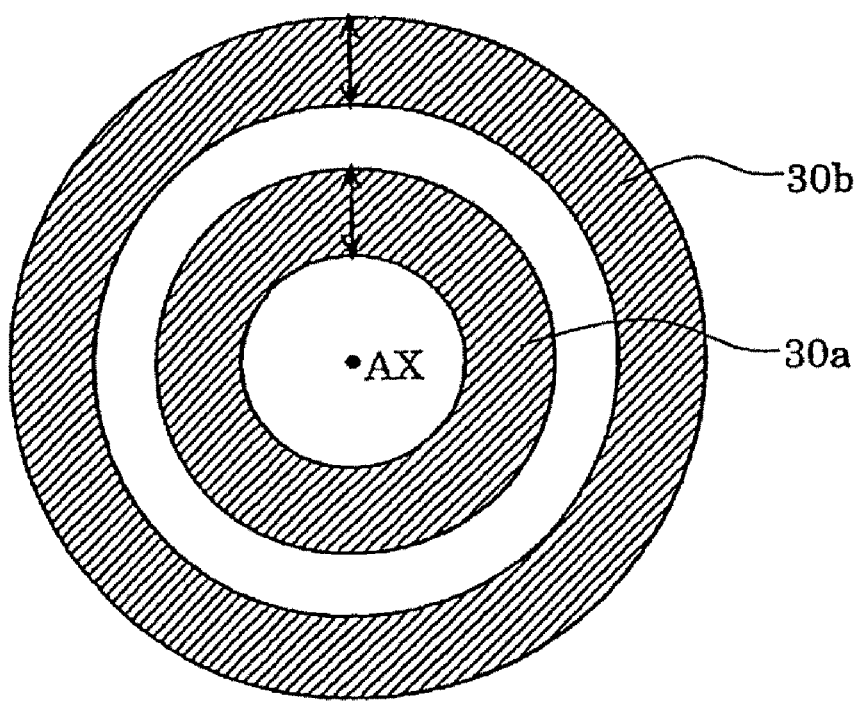
FIG. 2 is a drawing for explaining an action of a conical axicon system on an annular secondary light source.

FIG. 2 is a drawing for explaining the action of the conical axicon system on a secondary light source of annular shape. With reference to FIG. 2, a secondary light source 30a of the smallest annular shape formed in a state in which the distance of the conical axicon system 8 is zero and in which the focal length of the zoom lens 9 is set to a minimum (hereinafter referred to as "standard state") is changed into a secondary light source 30b of an annular shape with the outside diameter and inside diameter both increased, without change in the width thereof (half of the difference between the outside diameter and inside diameter: indicated by arrows in the drawing) when the distance of the conical axicon system 8 is increased from zero to a predetermined value. In other words, the annular ratio (inside diameter/outside diameter) and size (outside diameter) of the secondary light source both vary without change in the width of the annular secondary light source, through the action of the conical axicon system 8.

Figure 3:
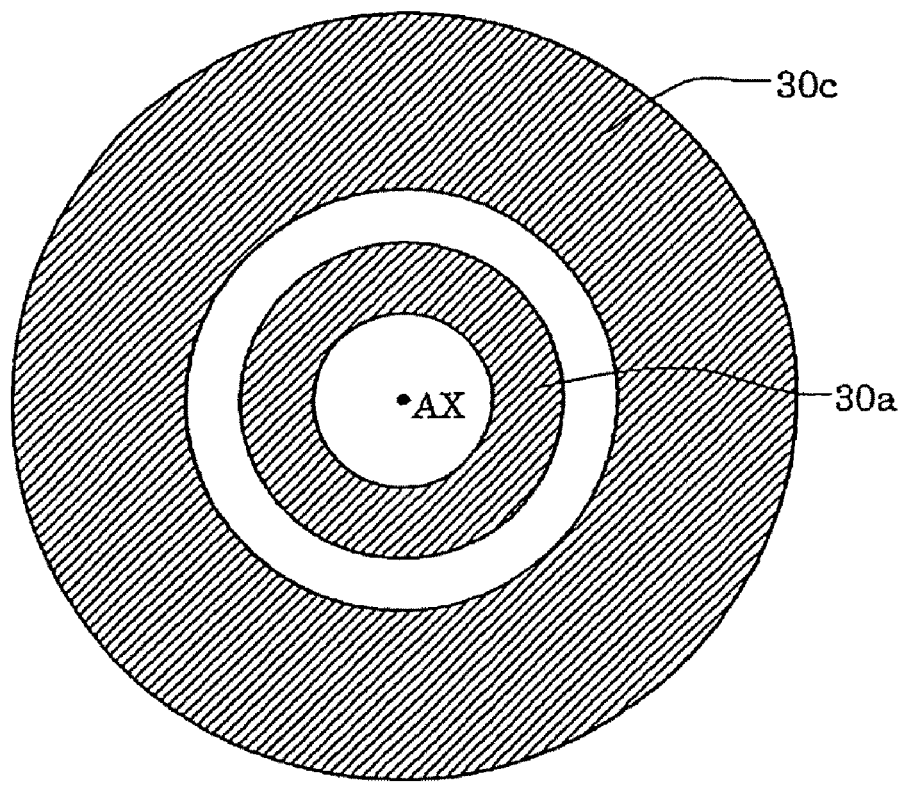
FIG. 3 is a drawing for explaining an action of a zoom lens on an annular secondary light source.

FIG. 3 is a drawing for explaining the action of the zoom lens on the secondary light source of annular shape. With reference to FIG. 3, the secondary light source 30a of the annular shape formed in the standard state is changed into a secondary light source 30c of an annular shape the entire shape of which is expanded into a similar shape, when the focal length of the zoom lens 9 is increased from a minimum value to a predetermined value. In other words, the width and size (outside diameter) of the secondary light source both vary, without change in the annular ratio of the annular secondary light source, through the action of the zoom lens 9.

Figure 4:
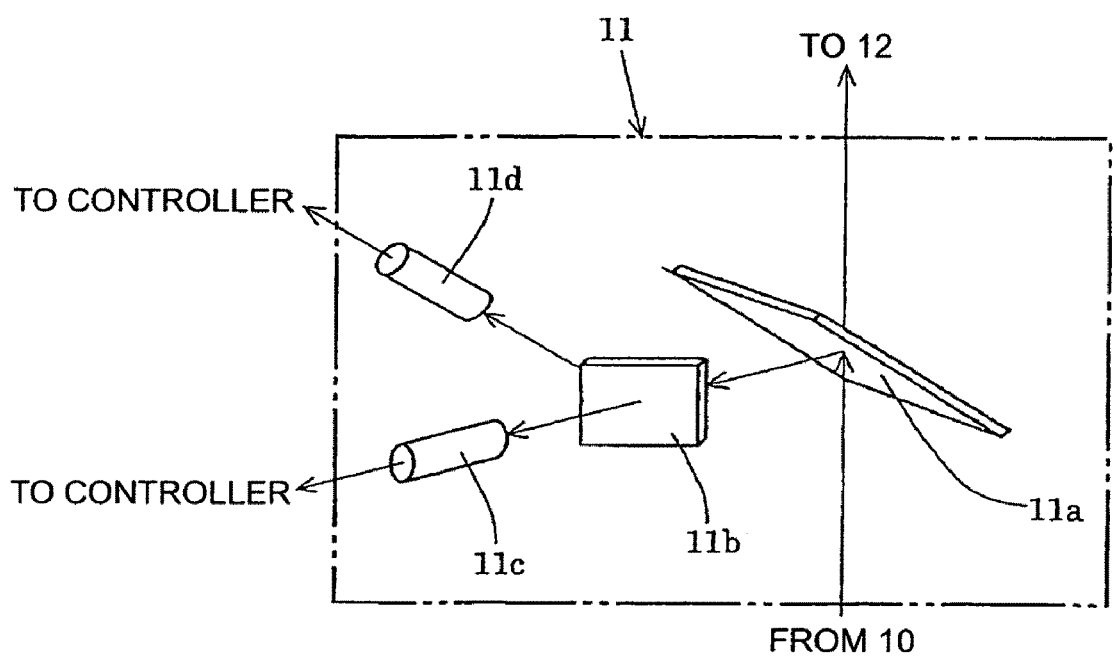
FIG. 4 is a perspective view schematically showing an internal configuration of a polarization monitor in FIG. 1.

FIG. 4 is a perspective view schematically showing an internal configuration of the polarization monitor in FIG. 1. With reference to FIG. 4, the polarization monitor 11 is provided with the first beam splitter 11a located in the optical path between the micro fly's eye lens 10 and the condenser optical system 12. The first beam splitter 11a has, for example, a form of a non-coated plane-parallel plate (i.e., raw glass) made of a silica glass, and has a function of extracting reflected light in a polarization state different from a polarization state of incident light, from the optical path.

The light extracted from the optical path by the first beam splitter 11a is incident to a second beam splitter 11b. The second beam splitter 11b, similar to the first beam splitter 11a, has a form of a non-coated plane-parallel plate made of a silica glass, for example, and has a function of generating reflected light in a polarization state different from a polarization state of incident light. The first beam splitter 11a and the second beam splitter 11b are so set that the p-polarization for the first beam splitter 11a is the s-polarization for the second beam splitter 11b and that the s-polarization for the first beam splitter 11a is the p-polarization for the second beam splitter 11b.

Light transmitted by the second beam splitter 11b is detected by a first optical intensity detector 11c and light reflected by the second beam splitter 11b is detected by a second optical intensity detector 11d. Outputs from the first optical intensity detector 11c and from the second optical intensity detector 11d are supplied respectively to a controller (not shown). The controller actuates the quarter-wave plate 4a, half-wave plate 4b, and depolarizer 4c constituting the polarization state converter 4, according to need.

In the first beam splitter 11a and the second beam splitter 11b, as described above, the reflectance for the p-polarization is substantially different from the reflectance for the s-polarization. In the polarization monitor 11, therefore, the reflected light from the first beam splitter 11a includes, for example, an s-polarization component (which is an s-polarization component for the first beam splitter 11a but p-polarization component for the second beam splitter 11b) which is approximately 10% of incident light to the first beam splitter 11a, and, for example, a p-polarization component (which is a p-polarization component for the first beam splitter 11a but s-polarization component for the second beam splitter 11b) which is approximately 1% of incident light to the first beam splitter 11a.

The reflected light from the second beam splitter 11b includes, for example, a p-polarization component (which is a p-polarization component for the first beam splitter 11a but s-polarization component for the second beam splitter 11b) which is approximately 10%×1%=0.1% of incident light to the first beam splitter 11a, and, for example, an s-polarization component (which is an s-polarization component for the first beam splitter 11a but p-polarization component for the second beam splitter 11b) which is approximately 1%×10%=0.1% of incident light to the first beam splitter 11a.

In the polarization monitor 11, as described above, the first beam splitter 11a has the function of extracting reflected light in a polarization state different from a polarization state of incident light, from the optical path in accordance with its reflection characteristic. In consequence, the polarization monitor 11 is able to detect the polarization state (degree of polarization) of incident light to the first beam splitter 11a and thus the polarization state of illumination light to the mask M, based on the output of the first optical intensity detector 11c (information about the intensity of transmitted light from the second beam splitter 11b, i.e., information about the intensity of light in much the same polarization state as the reflected light from the first beam splitter 11a), though slightly affected by variation in polarization due to the polarization characteristic of the second beam splitter 11b.

In addition, the polarization monitor 11 is so set that the p-polarization for the first beam splitter 11a is the s-polarization for the second beam splitter 11b and that the s-polarization for the first beam splitter 11a is the p-polarization for the second beam splitter 11b. As a result, the polarization monitor 11 is able to detect the quantity (intensity) of incident light to the first beam splitter 11a and thus the quantity of illumination light to the mask M, without substantially being affected by change in the polarization state of incident light to the first beam splitter 11a, based on the output of the second optical intensity detector 11d (information about the intensity of the light successively reflected by the first beam splitter 11a and the second beam splitter 11b).

The polarization monitor 11 is used in this manner to detect the polarization state of incident light to the first beam splitter 11a and thus to determine whether the illumination light to the mask M is in a desired unpolarized state, linear polarization state, or circular polarization state. When the controller confirms that the illumination light to the mask M (and thus to the wafer W) is not in the desired unpolarized state, linear polarization state, or circular polarization state, based on the result of the detection by the polarization monitor 11, it actuates and adjusts the quarter-wave plate 4a, half-wave plate 4b, and depolarizer 4c constituting the polarization state converter 4 to adjust the state of the illumination light to the mask M to the desired unpolarized state, linear polarization state, or circular polarization state.

When a diffractive optical element for quadrupole illumination (not shown) is set in the illumination optical path, instead of the diffractive optical element 5 for annular illumination, it can effect quadrupole illumination. The diffractive optical element for quadrupole illumination has the following function: when a parallel light beam having a rectangular cross section is incident thereto, it forms an optical intensity distribution of quadrupole shape in its far field. Therefore, a light beam having passed through the diffractive optical element for quadrupole illumination forms an illumination field of quadrupole shape consisting of four circular illumination fields around the optical axis AX, for example, on the incidence surface of the micro fly's eye lens 10. As a result, a secondary light source of the same quadrupole shape as the illumination field formed on the incidence surface is also formed on the rear focal plane of the micro fly's eye lens 10.

When a diffractive optical element for circular illumination (not shown) is set in the illumination optical path, instead of the diffractive optical element 5 for annular illumination, it can effect normal circular illumination. The diffractive optical element for circular illumination has the following function: when a parallel light beam having a rectangular cross section is incident thereto, it forms an optical intensity distribution of circular shape in the far field. Therefore, a light beam having passed through the diffractive optical element for circular illumination forms an illumination field of circular shape consisting of a circular illumination field around the optical axis AX, for example, on the incidence surface of the micro fly's eye lens 10. As a result, the secondary light source of the same circular shape as the illumination field formed on the incidence surface is also formed on the rear focal plane of the micro fly's eye lens 10.

Furthermore, when another diffractive optical element for multi-pole illumination (not shown) is set in the illumination optical path, instead of the diffractive optical element 5 for annular illumination, it is feasible to implement one of various multi-pole illuminations (dipole illumination, octupole illumination, etc.). When the diffractive optical element 5 for annular illumination is replaced by a diffractive optical element (not shown) for forming an optical intensity distribution of an annular shape having an annular ratio different from that of the diffractive optical element 5, in its far field as set in the illumination optical path, it can expand the varying range of the annular ratio. Similarly, when the diffractive optical element 5 for annular illumination is replaced by a diffractive optical element with an appropriate characteristic (not shown) as set in the illumination optical path, it becomes feasible to implement one of illuminations of various forms.

Figure 5:
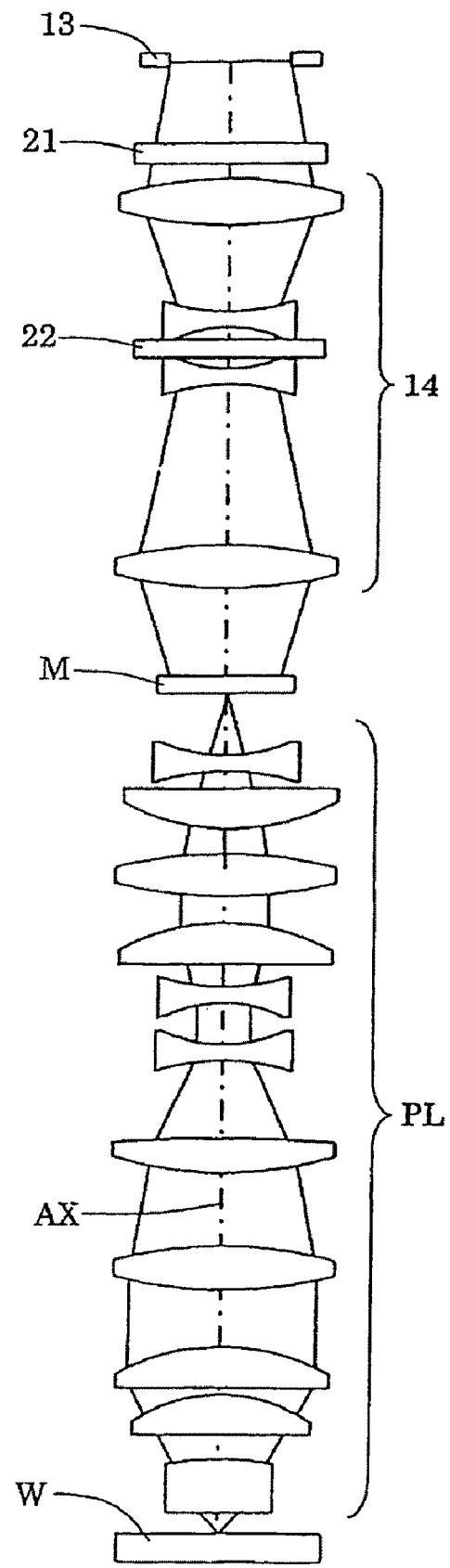
FIG. 5 is a drawing schematically showing a major configuration of an exposure apparatus according to an embodiment of the present invention, to show a configuration from a mask blind to a wafer.

FIG. 5 is a drawing schematically showing a major configuration of the exposure apparatus according to the present embodiment, and shows a configuration from the mask blind to the wafer. With reference to FIG. 5, the exposure apparatus of the present embodiment is so arranged that a birefringent element 21 is located in the optical path between the mask blind 13 and the imaging optical system 14 and that an optical rotator 22 is located at a predetermined position in the optical path of the imaging optical system 14. The present embodiment achieves a nearly azimuthal polarization state in a lens aperture of an optical system (a combined optical system of the illumination optical system (2-14) with the projection optical system PL) through collaboration of the birefringent element 21 and the optical rotator 22.

Figure 6:
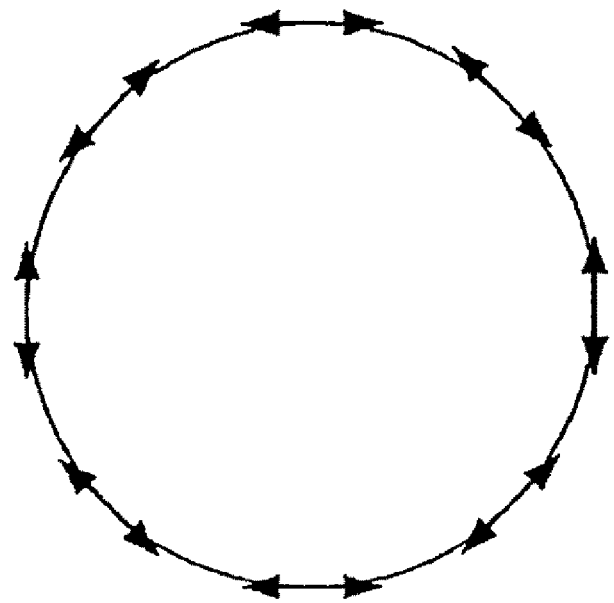
FIG. 6 shows (a) a linear polarization state of circumferential vibration in a lens aperture, and (b) a linear polarization state of radial vibration in a lens aperture.
Figure 6:
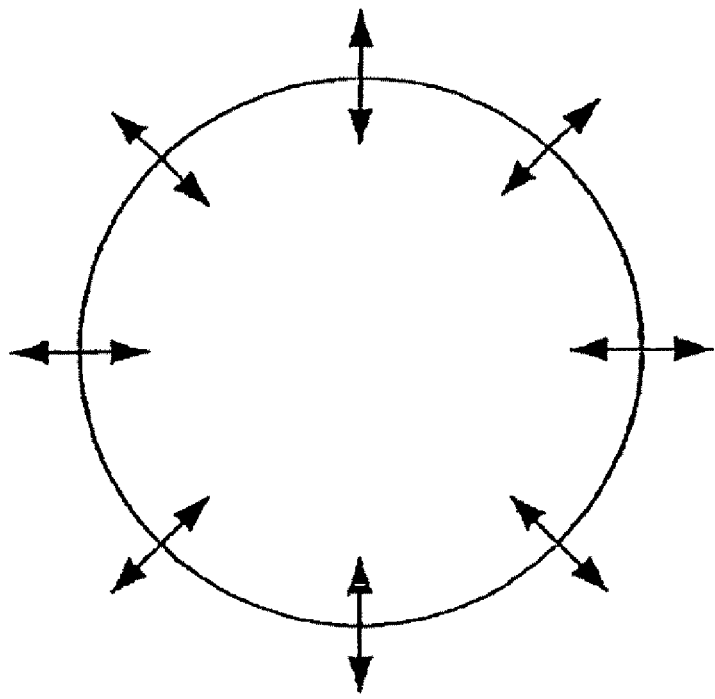

The general action of the birefringent element 21 and optical rotator 22, i.e., the basic principle of the present invention will be described below. In the present invention, linear polarization of circumferential vibration in the lens aperture of the optical system is defined as azimuthal polarization as shown in FIG. 6 (a), and linear polarization of radial vibration in the lens aperture as radial polarization as shown in FIG. 6 (b). In this case, coherency of two rays on the image plane in the optical system having a large image-side numerical aperture is higher in azimuthal polarization than in radial polarization. Therefore, when the polarization state of light in the lens aperture is set to a nearly azimuthal polarization state, a high-contrast object image can be obtained on the image plane.

Figure 7:
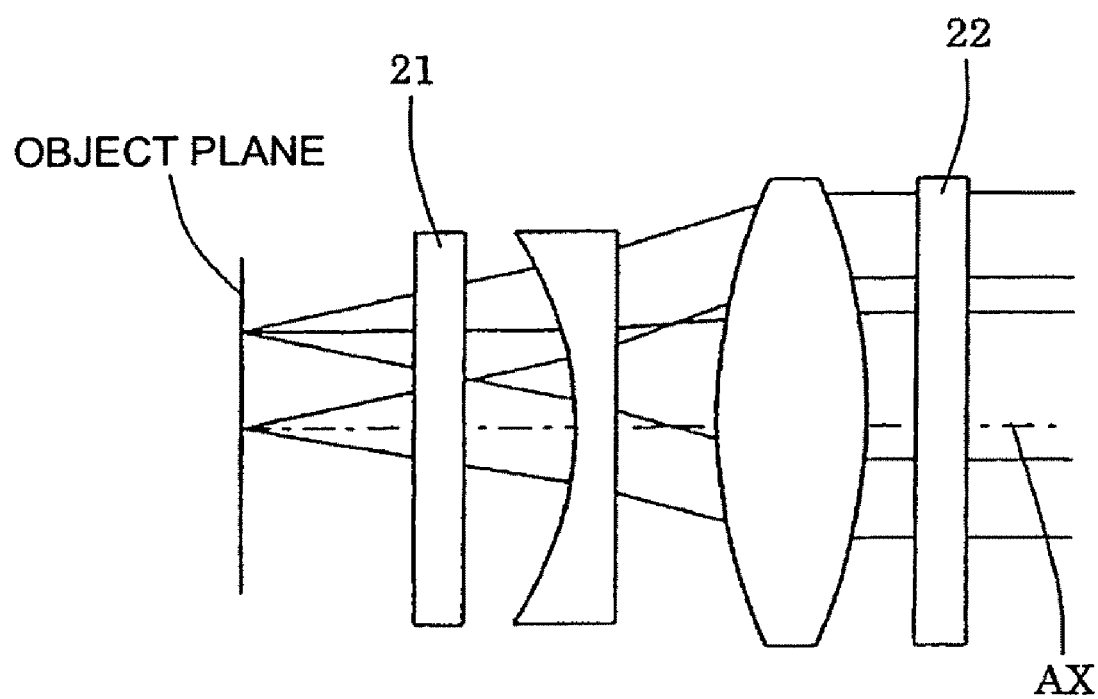
FIG. 7 is a drawing showing a state in which a birefringent element and an optical rotator are provided at predetermined positions in an optical path of an optical system telecentric on the object side.

In the present invention, therefore, in order to realize the nearly azimuthal polarization state in the lens aperture, as shown in FIG. 7, the birefringent element 21 and optical rotator 22 are provided at predetermined positions in the optical path of the optical system which is telecentric on the object side, for example. The birefringent element 21 is, for example, an optically transparent member of a plane-parallel plate shape made of a uniaxial crystal like rock crystal, and the crystallographic axis thereof is arranged in parallel with the optical axis AX. In this case, when a light beam of spherical waves is made incident to the birefringent element 21 made of a positive uniaxial crystal, a circumferential distribution around the optical axis AX is obtained as a fast axis distribution in the lens aperture of the optical system, as shown in FIG. 8 (a).

Figure 8:
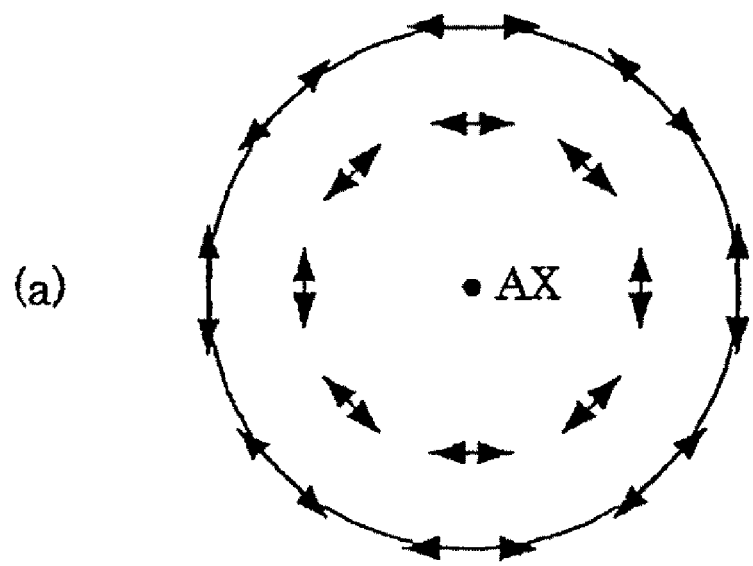
FIG. 8 shows (a) a circumferential fast axis distribution in a lens aperture, and (b) a radial fast axis distribution in a lens aperture.
Figure 8:
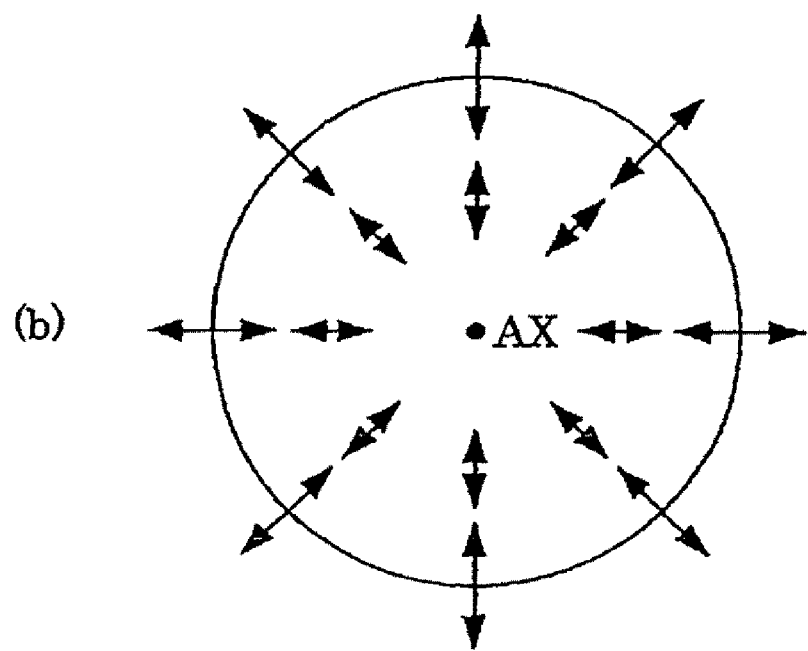
Figure 9:
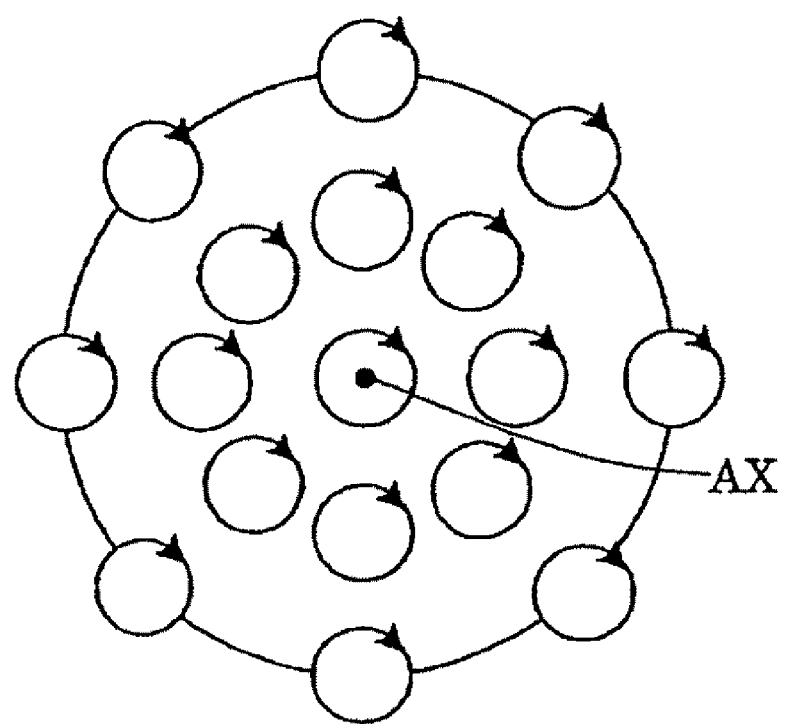
FIG. 9 is a drawing showing a polarization distribution in a lens aperture of circularly polarized light incident to a birefringent element.

On the other hand, if a light beam of spherical waves is made incident to the birefringent element 21 made of a negative uniaxial crystal, a radial distribution around the optical axis AX is obtained as a fast axis distribution in the lens aperture of the optical system, as shown in FIG. 8 (b). Let us suppose herein that a light beam of spherical waves in a circular polarization state having a polarization distribution in the lens aperture as shown in FIG. 9 is made incident to the birefringent element 21. Then the light beam having passed through the birefringent element 21 comes to have a polarization distribution in the lens aperture as shown in FIG. 10 (a) or (b).

Figure 10:
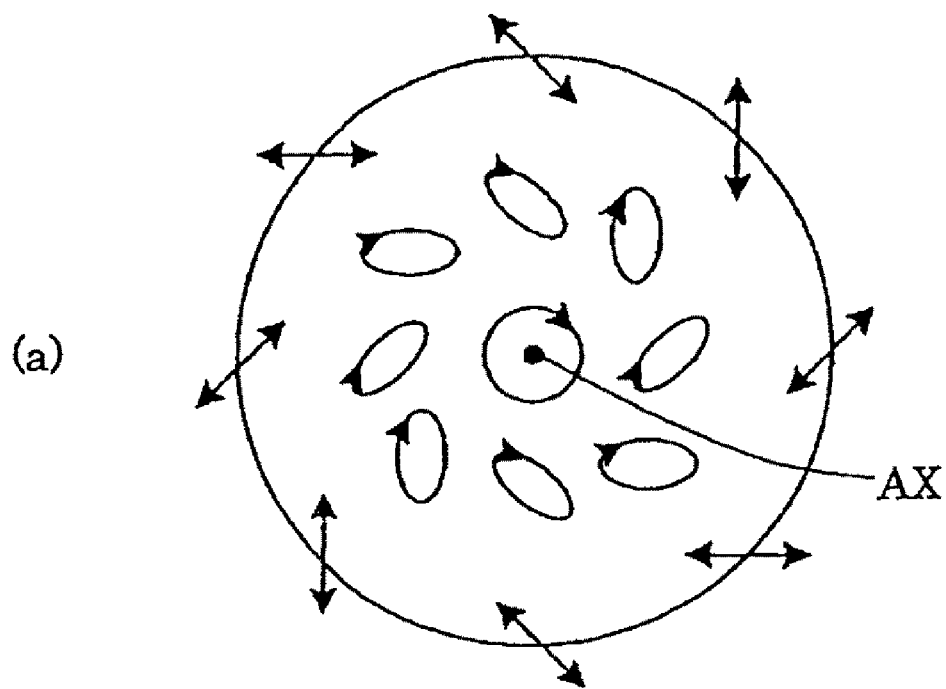
FIG. 10 is a drawing showing polarization distributions in a lens aperture of a light beam having passed through a birefringent element.
Figure 10:
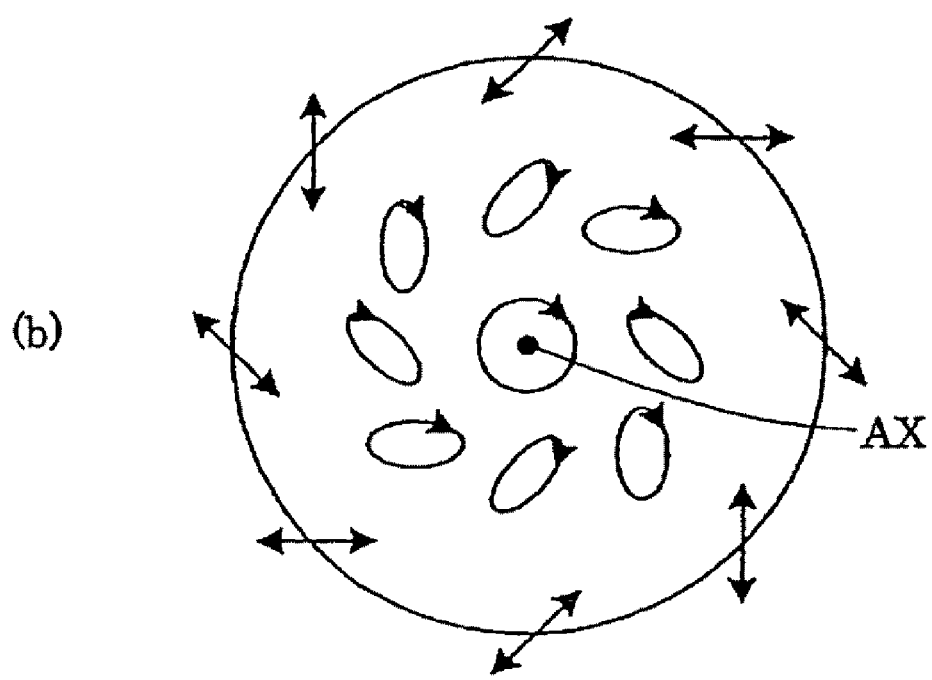

The polarization distribution shown in FIG. 10 (a) is obtained when clockwise circularly polarized light as shown in FIG. 9 is made incident to the birefringent element 21 corresponding to the fast axis distribution of FIG. 8 (a), i.e., the birefringent element 21 made of a positive uniaxial crystal. On the other hand, the polarization distribution shown in FIG. 10 (b) is obtained when clockwise circularly polarized light as shown in FIG. 9 is made incident to the birefringent element 21 corresponding to the fast axis distribution of FIG. 8 (b), i.e., the birefringent element 21 made of a negative uniaxial crystal.

The optical rotator 22 is, for example, an optically transparent member of a plane-parallel plate shape made of an optical material with optical rotatory power like rock crystal, and is located behind the birefringent element 21 (on the image side). The optical rotator 22 is arranged so that the crystallographic axis thereof is parallel to the optical axis AX, and has a function of rotating a polarization state in a lens aperture by a predetermined angle according to a thickness thereof, an angle of incidence of a light beam, or the like. In the present invention, the polarization state of the light beam having passed through the birefringent element 21 is rotated by 45° (i.e., the polarization state in the lens aperture is rotated by 45°) by the action of the optical rotator 22, to obtain a polarization distribution in the lens aperture as shown in FIG. 11.

Figure 11:
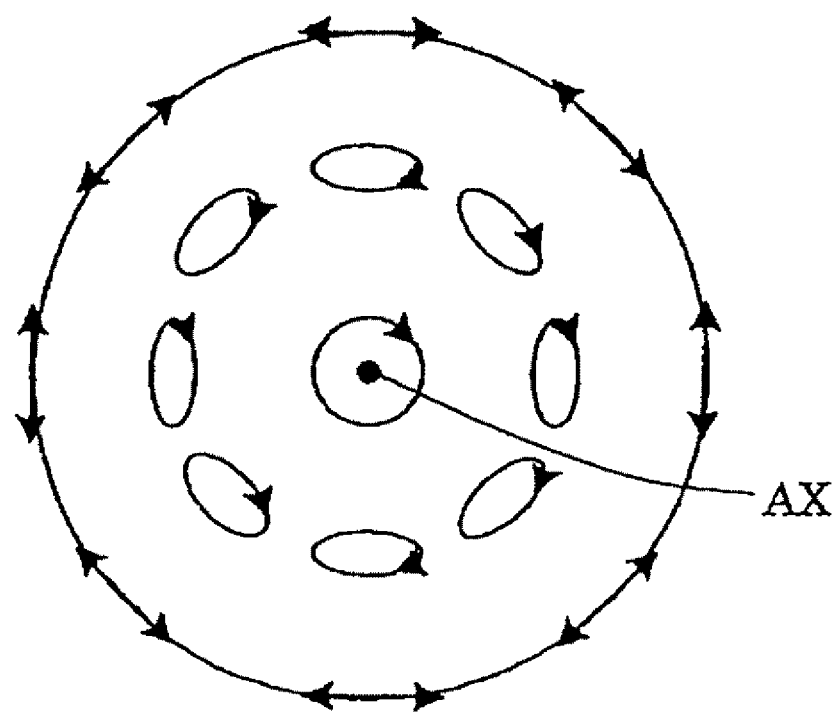
FIG. 11 is a drawing showing a polarization distribution in a lens aperture obtained through a birefringent element and an optical rotator.

However, where the birefringent element 21 is one made of a positive uniaxial crystal, the birefringent element 21 provides the polarization distribution shown in FIG. 10 (a) and it is thus necessary to use the optical rotator 22 made of an optical material with counterclockwise optical rotatory power in order to obtain the polarization distribution in the lens aperture as shown in FIG. 11. On the other hand, where the birefringent element 21 is one made of a negative uniaxial crystal, the birefringent element 21 provides the polarization distribution shown in FIG. 10 (b) and it is thus necessary to use the optical rotator 22 made of an optical material with clockwise optical rotatory power in order to obtain the polarization distribution in the lens aperture as shown in FIG. 11.

It is seen with reference to the polarization distribution in the lens aperture shown in FIG. 11 that a ray passing the center (optical axis AX) of the lens aperture is in a circular polarization state, polarization states vary from an elliptic polarization state to a linear polarization state toward the periphery of the aperture, and the polarization states are distributed with rotational symmetry with respect to the optical axis AX. In the polarization distribution in the lens aperture shown in FIG. 11, as described above, the azimuthal polarization state (linear polarization state of circumferential vibration around the optical axis AX) is not achieved throughout the whole area in the lens aperture, but the azimuthal polarization state is achieved at least in the peripheral region of the lens aperture.

When consideration is given to the fact that degradation of coherency in formation of image is greater for rays in the peripheral region of the lens aperture than for rays in the central region of the lens aperture, the polarization distribution in which the azimuthal polarization state is achieved in the peripheral region of the lens aperture as shown in FIG. 11 is approximately equivalent to the polarization distribution in which the azimuthal polarization state is achieved throughout the whole area of the lens aperture as shown in FIG. 6 (a), in terms of improvement in the contrast of the object image. In the present invention, as described above, the nearly azimuthal polarization state in the lens aperture can be realized through collaboration of the birefringent element 21 and optical rotator 22, whereby the high-contrast object image can be obtained eventually on the image plane. In the polarization distribution in the lens aperture shown in FIG. 11, the azimuthal polarization state is achieved in the outermost peripheral region of the lens aperture, but the region in the lens aperture where the azimuthal polarization state is achieved does not have to be limited to the outermost periphery. The region can be appropriately set according to need. When the polarization distribution where the azimuthal polarization state is achieved in the peripheral region of the lens aperture as shown in FIG. 11 is combined with the annular illumination or multi-pole illumination such as dipole or quadrupole illumination, the polarization distribution in the illumination light beam turns into a nearly azimuthal polarization state and thus a higher-contrast object image can be obtained on the image plane.

The birefringent element can be an optically transparent member made of an appropriate optical material except for rock crystal, e.g., an optical material with linear birefringence such as $MgF_2$ or $LiCaAlF_6$ (lithium calcium aluminum fluoride). In another potential example, the birefringent element is, for example, a pair of optically transparent members made of a crystal material of the cubic system like fluorite, and the pair of optically transparent members are positioned so that the fast axis distribution in the lens aperture becomes a nearly circumferential distribution or a nearly radial distribution.

Specifically, the birefringent element can be a pair of optically transparent members arranged in a state in which the crystal orientation <111> is parallel to the optical axis and in which the other crystal orientations are relatively rotated by about 60° around the optical axis. In this case, when a light beam of spherical waves is made incident to the birefringent element consisting of the pair of optically transparent members, a circumferential distribution about the optical axis AX is obtained as the fast axis distribution in the lens aperture of the optical system as shown in FIG. 8 (a), just as in the case of the birefringent element made of a positive uniaxial crystal. Accordingly, when a light beam of spherical waves is made incident in a clockwise circular polarization state as shown in FIG. 9, the polarization distribution in the lens aperture as shown in FIG. 10 (a) is obtained.

The birefringent element can also be a pair of optically transparent members arranged in a state in which the crystal orientation <100> is approximately parallel to the optical axis and in which the other crystal orientations are relatively rotated by about 45° around the optical axis. In this case, when a light beam of spherical waves is made incident to the birefringent element consisting of the pair of optically transparent members, a radial distribution around the optical axis AX is obtained as the fast axis distribution in the lens aperture of the optical system as shown in FIG. 8 (b), just as in the case of the birefringent element made of a negative uniaxial crystal. Therefore, when a light beam of spherical waves is made incident in a clockwise circular polarization state as shown in FIG. 9, the polarization distribution in the lens aperture as shown in FIG. 10 (b) is obtained.

The birefringent element made of the uniaxial crystal, and the birefringent element consisting of the pair of optically transparent members made of the crystal material of the cubic system are elements in which the amount of birefringence varies according to angles of incidence. Therefore, when a light beam of spherical waves is made incident, the birefringent element functions as one having the fast axis distribution as shown in FIG. 8 (a) or (b), to obtain the polarization distribution in the lens aperture as shown in FIG. 10 (a) or (b). For making the polarization distribution in the lens aperture approximately uniform in the plane, as shown in FIG. 7, it is preferable to place the birefringent element of a uniaxial crystal (or the birefringent element consisting of the pair of optically transparent members) 21 in an approximately telecentric optical path.

On the other hand, the optical rotator 22 preferably uniformly rotates the polarization state in the lens aperture. Therefore, the optical rotator 22 is preferably located at a position where there is little variation in the angle of incidence of the light beam, as shown in FIG. 7. Specifically, the optical rotator 22 is preferably located at a position where the light beam is incident with variation of not more than 10° in the angle of incidence, and the optical rotator 22 is more preferably located at a position where the light beam is incident with variation of not more than 7° in the angle of incidence. Besides rock crystal, the optical rotator 22 can be made of an appropriate optical material with optical rotatory power.

Referring again to FIG. 5, the exposure apparatus of the present embodiment is arranged so that the birefringent element of an optically transparent member made of a uniaxial crystal, for example, like rock crystal (or the birefringent element consisting of a pair of optically transparent members made of a crystal material of the cubic system, for example, like fluorite) 21 is located in the optical path between the mask blind 13 and the imaging optical system 14, i.e., in the nearly telecentric optical path near the mask blind 13 located at the position optically conjugate with the mask M being a surface to be illuminated. In addition, the optical rotator 22, for example, made of rock crystal is located at the position where the light beam is incident, for example, with variation of not more than 10° in the angle of incidence, in the optical path of the imaging optical system 14.

In this state, when the half-wave plate 4b and depolarizer 4c both are retracted from the illumination optical path and when the crystallographic axis of the quarter-wave plate 4a is set at a predetermined angle relative to incident elliptically polarized light, a light beam of nearly spherical waves is incident in a circular polarization state to the birefringent element 21. As a result, the present embodiment is able to achieve the nearly azimuthal polarization state in the lens aperture while suppressing the loss of light quantity, based on the simple configuration, through collaboration of the birefringent element 21 for achieving the nearly circumferential distribution or the nearly radial distribution as the fast axis distribution in the lens aperture, and the optical rotator 22 disposed behind it and adapted to rotate the polarization state in the lens aperture. Therefore, the present embodiment is able to form the high-contrast image of the microscopic pattern of the mask M on the wafer W to effect high-throughput and faithful exposure.

Figure 12:
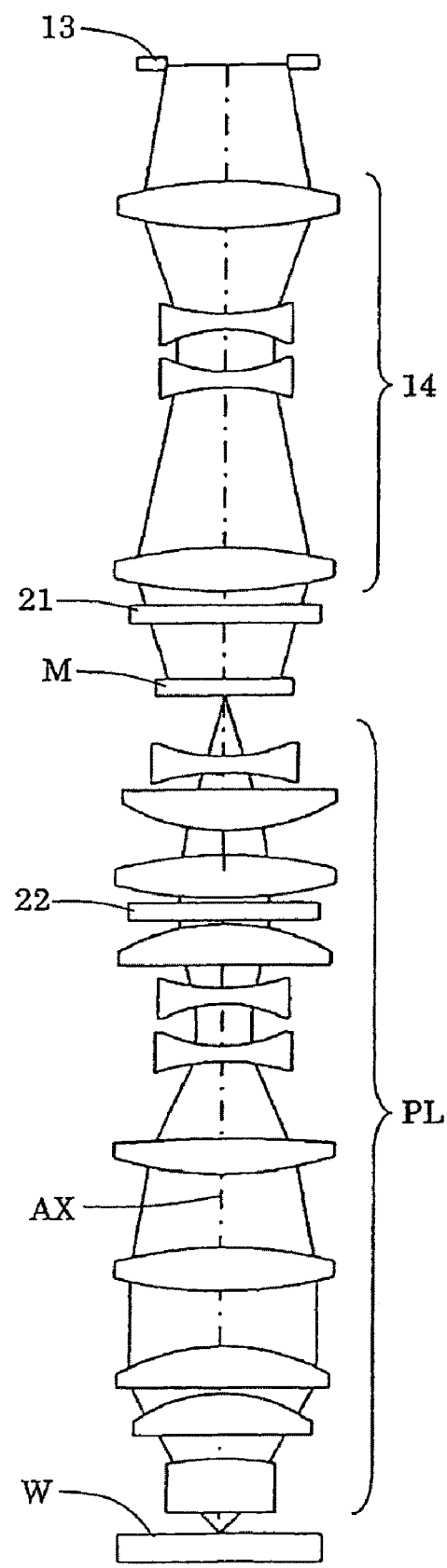
FIG. 12 is a drawing schematically showing a major configuration of an exposure apparatus according to a first modification example of the embodiment of the present invention.

FIG. 12 is a drawing schematically showing a major configuration of an exposure apparatus according to a first modification example of the present embodiment. In the first modification example, the configuration from the mask blind 13 to the wafer W is similar to that in the embodiment shown in FIG. 5. However, the first modification example is different from the embodiment shown in FIG. 5, in that the birefringent element 21 is located in the optical path between the imaging optical system 14 and the mask M and in that the optical rotator 22 is located at a predetermined position in the optical path of the projection optical system PL.

Namely, in the first modification example the birefringent element 21 is located in the nearly telecentric optical path near the mask M, in the optical path of the illumination optical system (2-14). Furthermore, the optical rotator 22 is located at a position relatively close to the mask M in the optical path of the projection optical system PL, e.g., at a position where the light beam is incident with variation of not more than 10° in the angle of incidence. As a result, the first modification example is also able to achieve the nearly azimuthal polarization state in the lens aperture while suppressing the loss of light quantity, based on the simple configuration, through collaboration of the birefringent element 21 and the optical rotator 22 as the embodiment of FIG. 5 was.

Figure 13:
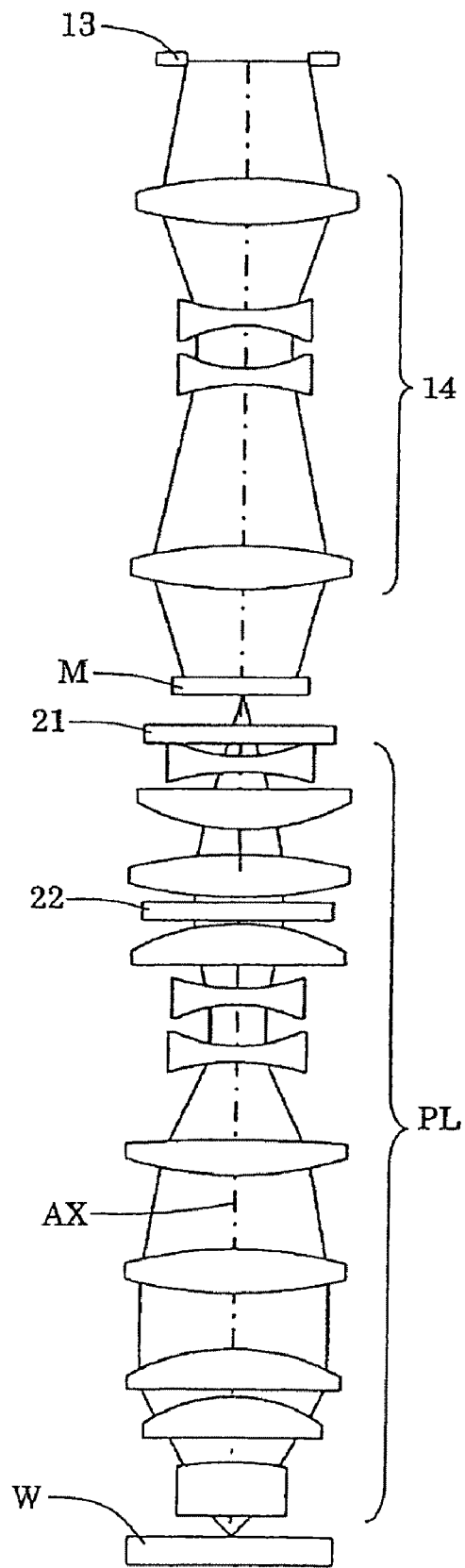
FIG. 13 is a drawing schematically showing a major configuration of an exposure apparatus according to a second modification example of the embodiment of the present invention.

FIG. 13 is a drawing schematically showing a major configuration of an exposure apparatus according to a second modification example of the present embodiment. In the second modification example, just as in the first modification example, the configuration from the mask blind 13 to the wafer W is similar to that in the embodiment shown in FIG. 5. However, the second modification example is different from the embodiment shown in FIG. 5, in that the birefringent element 21 is located in the optical path between the mask M and the projection optical system PL and in that the optical rotator 22 is located at a predetermined position in the optical path of the projection optical system PL.

Namely, in the second modification example the birefringent element 21 is located in the nearly telecentric optical path near the mask M, in the optical path of the projection optical system PL. Furthermore, the optical rotator 22 is located at a position relatively close to the mask M in the optical path of the projection optical system PL, e.g., at a position where the light beam is incident with variation of not more than 10° in the angle of incidence. As a result, the second modification example is also able to achieve the nearly azimuthal polarization state in the lens aperture while suppressing the loss of light quantity, based on the simple configuration, through collaboration of the birefringent element 21 and the optical rotator 22 as the embodiment of FIG. 5 was.

Figure 14:
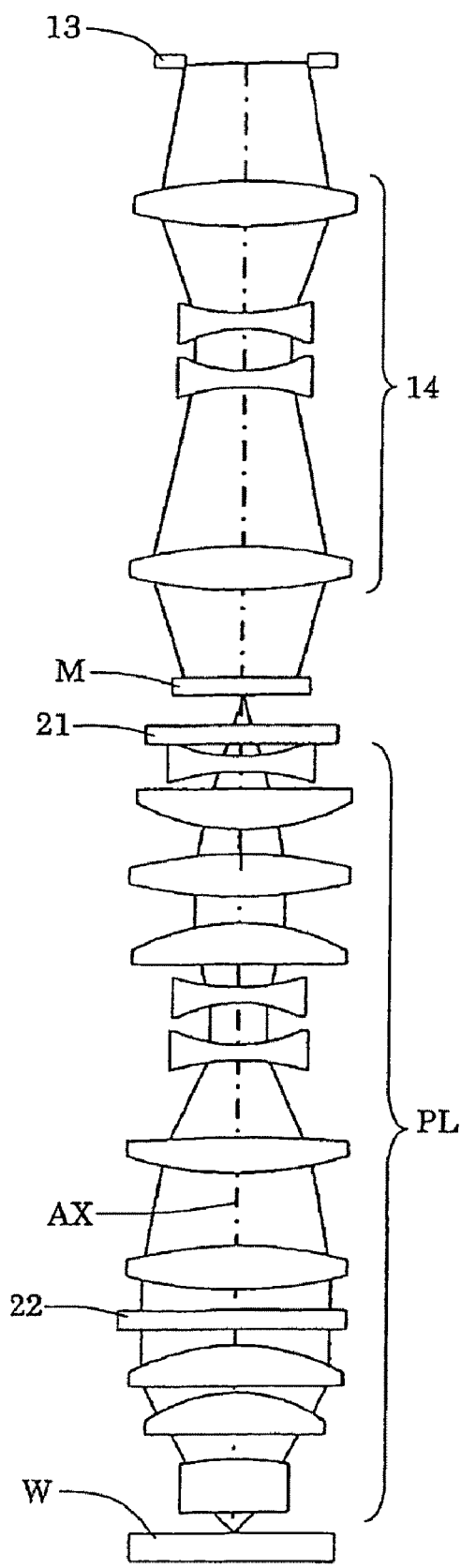
FIG. 14 is a drawing schematically showing a major configuration of an exposure apparatus according to a third modification example of the embodiment of the present invention.

FIG. 14 is a drawing schematically showing a major configuration of an exposure apparatus according to a third modification example of the present embodiment. In the third modification example, just as in the first modification example and the second modification example, the configuration from the mask blind 13 to the wafer W is similar to that in the embodiment shown in FIG. 5. However, the third modification example is different from the embodiment shown in FIG. 5, in that the birefringent element 21 is located in the optical path between the mask M and the projection optical system PL and in that the optical rotator 22 is located at a predetermined position in the optical path of the projection optical system PL.

Namely, in the third modification example, as in the second modification example, the birefringent element 21 is located in the nearly telecentric optical path near the mask M (i.e., in the optical path nearly telecentric on the mask M side), in the optical path of the projection optical system PL. However, different from the second modification example, the optical rotator 22 is located at a position relatively close to the wafer W in the optical path of the projection optical system PL, e.g., at a position where the light beam is incident with variation of not more than 10° in the angle of incidence. As a result, the third modification example is also able to achieve the nearly azimuthal polarization state in the lens aperture while suppressing the loss of light quantity, based on the simple configuration, through collaboration of the birefringent element 21 and the optical rotator 22 as the embodiment shown in FIG. 5 was.

Figure 15:
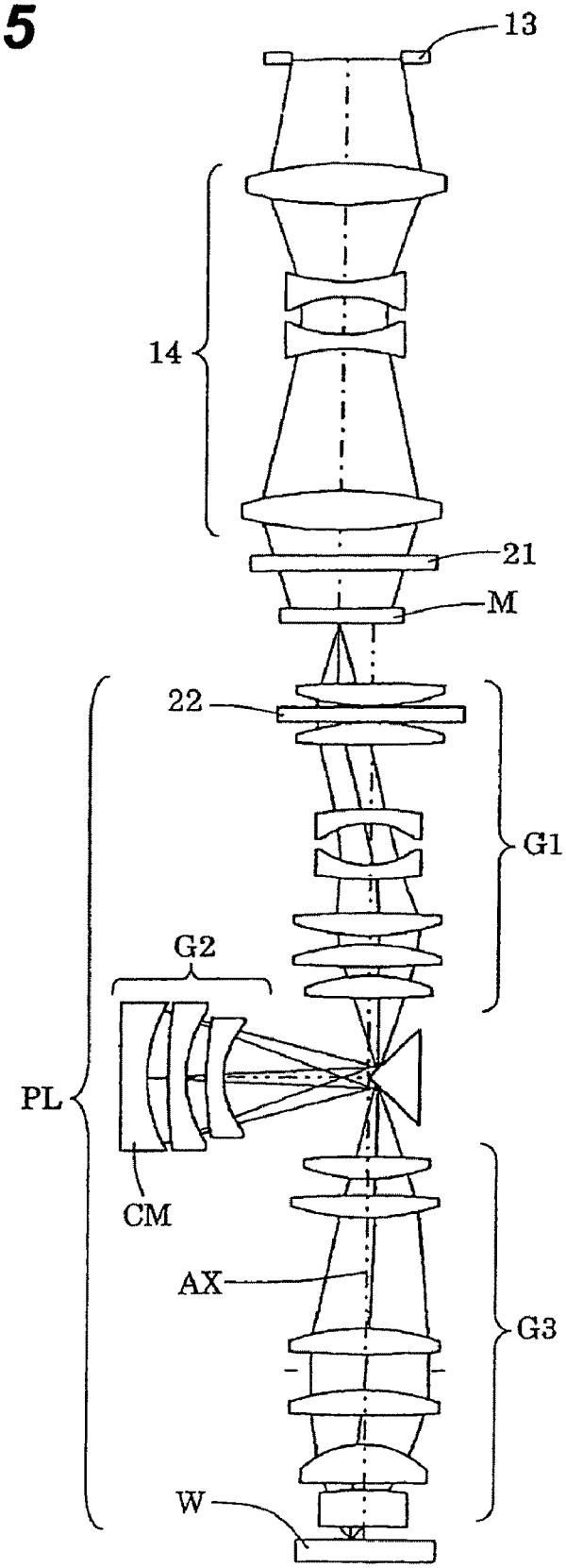
FIG. 15 is a drawing schematically showing a major configuration of an exposure apparatus according to a fourth modification example of the embodiment of the present invention.

FIG. 15 is a drawing schematically showing a major configuration of an exposure apparatus according to a fourth modification example of the present embodiment. In the fourth modification example the configuration from the mask blind 13 to the mask M is similar to that in the embodiment shown in FIG. 5. However, the fourth modification example is different from the embodiment of FIG. 5 in that, while the projection optical system PL in the embodiment of FIG. 5 is a dioptric system, the projection optical system PL of the fourth modification example is a catadioptric system of a threefold imaging type including a concave mirror CM. The fourth modification example is also different from the embodiment shown in FIG. 5, in that the birefringent element 21 is located in the optical path between the imaging optical system 14 and the mask M and in that the optical rotator 22 is located at a predetermined position in the optical path of the projection optical system PL.

Namely, in the fourth modification example the birefringent element 21 is located in the nearly telecentric optical path near the mask M, in the optical path of the illumination optical system (2-14). Furthermore, the optical rotator 22 is located at a position relatively close to the mask M in an optical path of a first imaging optical system G1 in the projection optical system PL, e.g., at a position where the light beam is incident with variation of not more than 10° in the angle of incidence. As a result, the fourth modification example is also able to achieve the nearly azimuthal polarization state in the lens aperture while suppressing the loss of light quantity, based on the simple configuration, through collaboration of the birefringent element 21 and the optical rotator 22 as the embodiment of FIG. 5 was.

Figure 16:
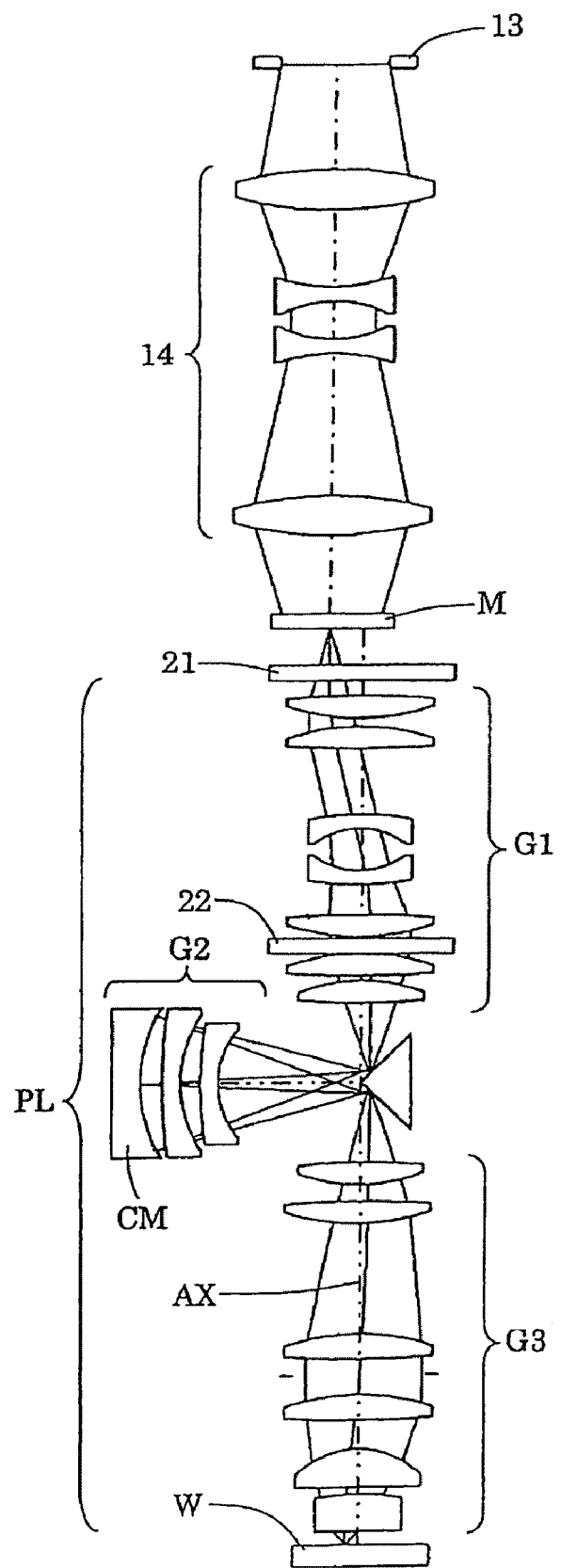
FIG. 16 is a drawing schematically showing a major configuration of an exposure apparatus according to a fifth modification example of the embodiment of the present invention.

FIG. 16 is a drawing schematically showing a major configuration of an exposure apparatus according to a fifth modification example of the present embodiment. In the fifth modification example the configuration from the mask blind 13 to the mask M is similar to that in the fourth modification example of FIG. 15. However, the fifth modification example is different from the fourth modification example of FIG. 15 in that the birefringent element 21 is located in the optical path between the mask M and the projection optical system PL and in that the optical rotator 22 is located at a predetermined position in the optical path of the projection optical system PL.

Namely, in the fifth modification example the birefringent element 21 is located in the nearly telecentric optical path near the mask M (i.e., in the optical path nearly telecentric on the mask M side), in the optical path of the projection optical system PL. Furthermore, the optical rotator 22 is located at a position relatively close to the wafer W in the optical path of the first imaging optical system G1 in the projection optical system PL, e.g., at a position where the light beam is incident with variation of not more than 10° in the angle of incidence. As a result, the fifth modification example is also able to achieve the nearly azimuthal polarization state in the lens aperture while suppressing the loss of light quantity, based on the simple configuration, through collaboration of the birefringent element 21 and the optical rotator 22 as the fourth modification example was.

Figure 17:
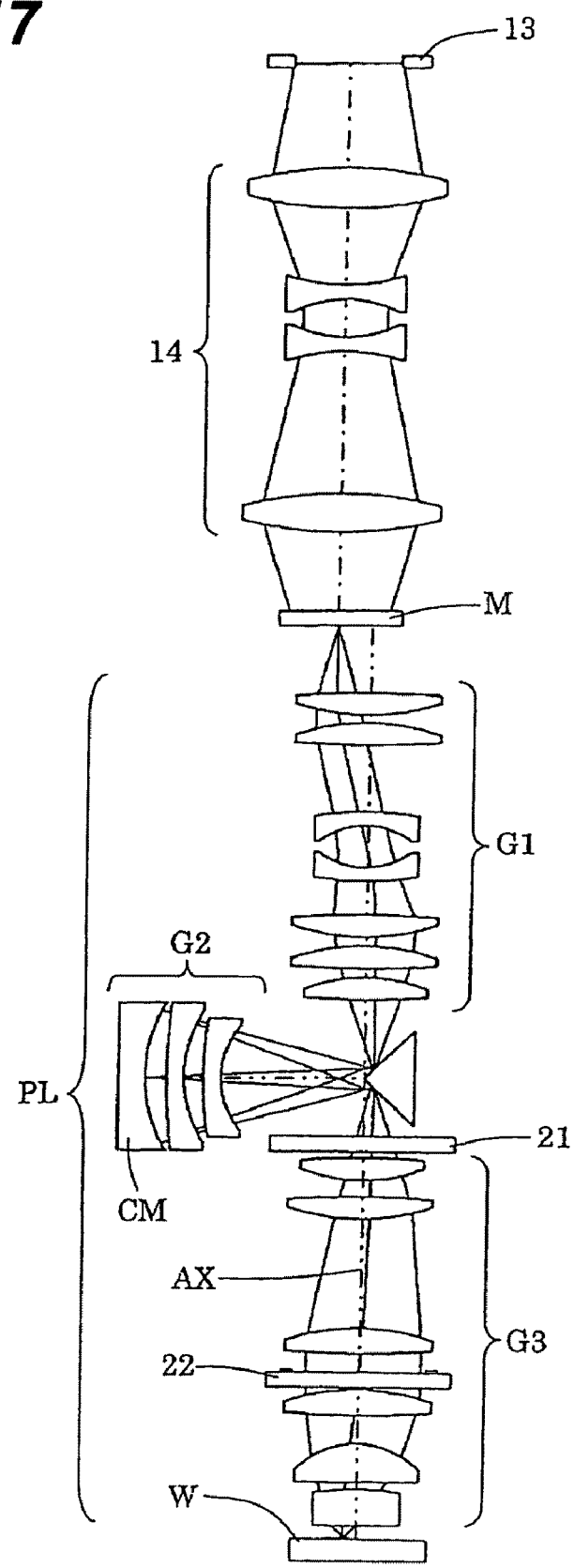
FIG. 17 is a drawing schematically showing a major configuration of an exposure apparatus according to a sixth modification example of the embodiment of the present invention.

FIG. 17 is a drawing schematically showing a major configuration of an exposure apparatus according to a sixth modification example of the present embodiment. In the sixth modification example the configuration from the mask blind 13 to the mask M is similar to that in the fourth modification example of FIG. 15. However, the sixth modification example is different from the fourth modification example of FIG. 15 in that the birefringent element 21 and the optical rotator 22 both are located at predetermined positions in the optical path of the projection optical system PL.

Namely, in the sixth modification example the birefringent element 21 is located at a position optically conjugate with the mask M (i.e., at a position where a secondary image of mask M is formed) or in a nearly telecentric optical path near the conjugate position, in an optical path between a second imaging optical system G2 and a third imaging optical system G3. Furthermore, the optical rotator 22 is located at a position relatively close to the wafer W in an optical path of the third imaging optical system G3 of the projection optical system PL, e.g., at a position where the light beam is incident with variation of not more than 10° in the angle of incidence. As a result, the sixth modification example is also able to achieve the nearly azimuthal polarization state in the lens aperture while suppressing the loss of light quantity, based on the simple configuration, through collaboration of the birefringent element 21 and the optical rotator 22 as the fourth modification example was. In the sixth modification example the birefringent element 21 is located in the optical path on the wafer W side with respect to the optical path folding mirror in the projection optical system PL. In the case of this configuration, even if there occurs a phase difference due to reflection between the p-polarization and the s-polarization for the optical path folding mirror, the polarization state after the reflection can be nearly circular polarization when the polarization state impinging upon the optical path folding mirror is elliptic polarization. Therefore, the sixth modification example is more preferably adopted than the aforementioned fifth modification example in the case where the optical path folding mirror is located in the projection optical system.

In the embodiment of FIG. 5 and in the first modification example to the sixth modification example, the birefringent element 21 is an optically transparent member made of a uniaxial crystal, for example, like rock crystal or a pair of optically transparent members made of a crystal material of the cubic system, for example, like fluorite. However, the birefringent element does not have to be limited to those, but the birefringent element can also be an optically transparent member with internal stress substantially with rotational symmetry with respect to the optical axis, e.g., an optically transparent member like a plane-parallel plate of silica.

In this case, when a light beam of plane waves in a substantially circular polarization state is made incident to the birefringent element consisting of the optically transparent member with internal stress substantially which is rotational symmetry with respect to the optical axis, the polarization distribution in the lens aperture as shown in FIG. 10 (a) or (b) can be obtained. For making the polarization distribution in the lens aperture approximately uniform in the plane, the birefringent element consisting of the optically transparent member with internal stress is preferably located near the pupil of the optical system (in the embodiment of FIG. 5, for example, a position near the pupil of the imaging optical system 14 and closer to the light source than the optical rotator 22). Concerning the details of a method of providing the optically transparent member, for example, like the plane-parallel plate of silica with the substantially rotationally symmetric internal stress (to provide the member with a desired birefringence distribution), reference can be made, for example, to International Application Published under PCT WO03/007045 and the corresponding U.S. Pat. No. 6,788,389. The teachings of U.S. Pat. No. 6,788,389 are hereby incorporated by reference.

In the embodiment of FIG. 5 and in the first modification example to the sixth modification example, the nearly azimuthal polarization state in the lens aperture is achieved through collaboration of the two elements disposed with a spacing, i.e., the birefringent element 21 and the optical rotator 22. However, the nearly azimuthal polarization state in the lens aperture can also be achieved by using a birefringent optical rotator which is made of an optical material with linear birefringence and optical rotatory power and the optic axis of which is arranged substantially in parallel with the optical axis, e.g., a birefringent optical rotator consisting of an optically transparent member of a plane-parallel plate shape made of rock crystal, and making a light beam in a substantially circular polarization state incident to the birefringent optical rotator.

In this case, the birefringent optical rotator is located at a position where a light beam of substantially spherical waves is incident thereto, and has a required thickness for converting a light beam in a peripheral region of incident light into a light beam in a substantially linear polarization state of approximately circumferential vibration in the lens aperture. Namely, the relationship between the thickness of the birefringent optical rotator and angles of incident rays is so set that circularly polarized rays incident to the peripheral region of the birefringent optical rotator are converted into linearly polarized light by birefringence and that their polarization is rotated by 45° by optical rotatory power.

Figure 18:
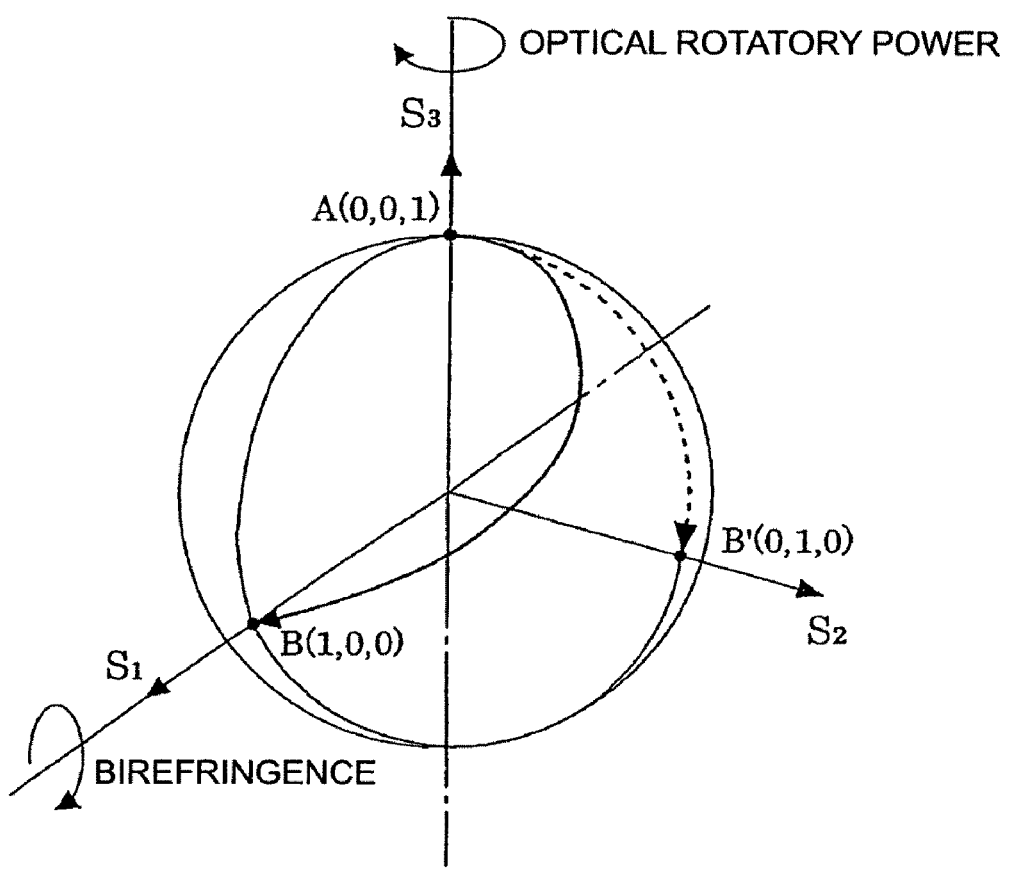
FIG. 18 is a drawing for explaining change of polarization states in a birefringent optical rotator with the Poincare sphere.

The change of polarization in the birefringent optical rotator will be described below with reference to the Poincare sphere shown in FIG. 18. In FIG. 18, $S_1$, $S_2$, and $S_3$ are the Stokes parameters to indicate a polarization state. In the birefringent optical rotator, light incident in a perfectly circular polarization state corresponding to point A (0,0,1) is subject to rotational action around the $S_1$ axis due to the birefringence and subject to rotational action around the $S_3$ axis due to the optical rotatory power, to reach a azimuthal polarization state corresponding to point B (1,0,0).

Incidentally, in the case of the aforementioned birefringent element 21, the light incident in a perfectly circular polarization state corresponding to point A (0,0,1) is subject to only rotational action around the $S_1$ axis due to the birefringence, to reach point B' (0,1,0). For adjusting the amount of the rotation and the amount of the birefringence in the birefringent optical rotator, the birefringent optical rotator is preferably comprised of a first optically transparent member made of an optical material with clockwise optical rotatory power (e.g., right-handed rock crystal), and a second optically transparent member made of an optical material with counterclockwise optical rotatory power (e.g., left-handed rock crystal).

Figure 19:
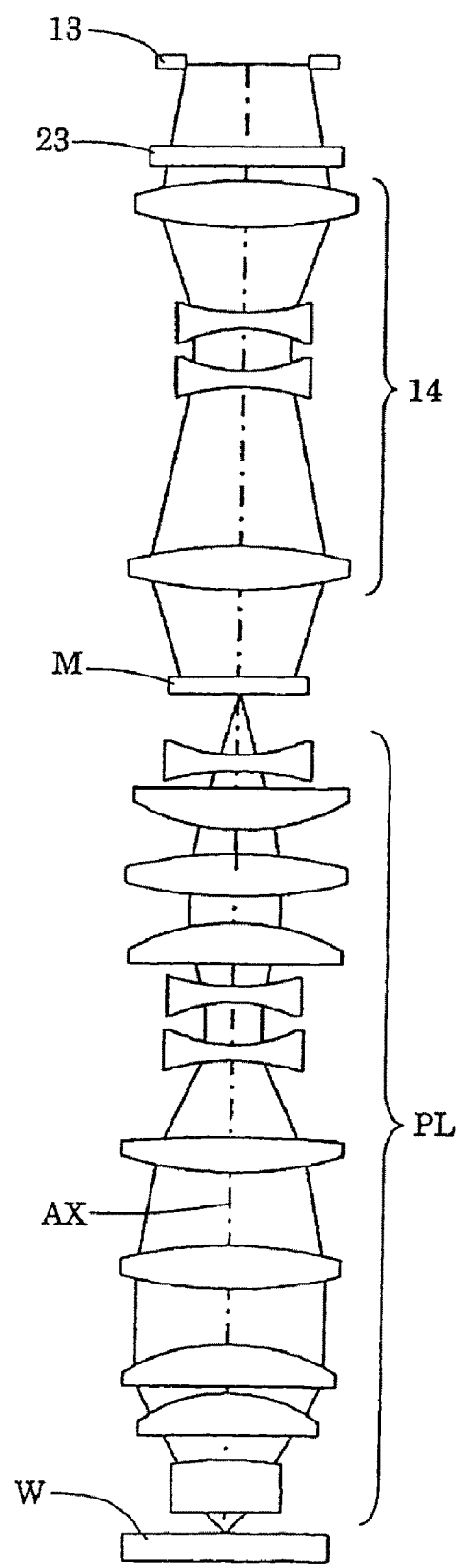
FIG. 19 is a drawing schematically showing a major configuration of an exposure apparatus according to a seventh modification example of the embodiment of the present invention.

FIG. 19 is a drawing schematically showing a major configuration of an exposure apparatus according to a seventh modification example of the present embodiment. In the seventh modification example the configuration from the mask blind 13 to the mask M is similar to that in the embodiment shown in FIG. 5. However, the seventh modification example is different from the embodiment shown in FIG. 5, in that the birefringent element 21 and the optical rotator 22 are replaced by a birefringent optical rotator 23 disposed in the optical path between the mask blind 13 and the imaging optical system 14.

Namely, in the seventh modification example the birefringent optical rotator 23 is located in the nearly telecentric optical path near the mask blind 13 located at the position optically conjugate with the mask M being a surface to be illuminated, in the optical path of the illumination optical system (2-14). As a result, the seventh modification example is also able to achieve the nearly azimuthal polarization state in the lens aperture while suppressing the loss of light quantity, based on the simple configuration, through the action of the birefringent optical rotator 23 as the embodiment of FIG. 5 was.

Figure 20:
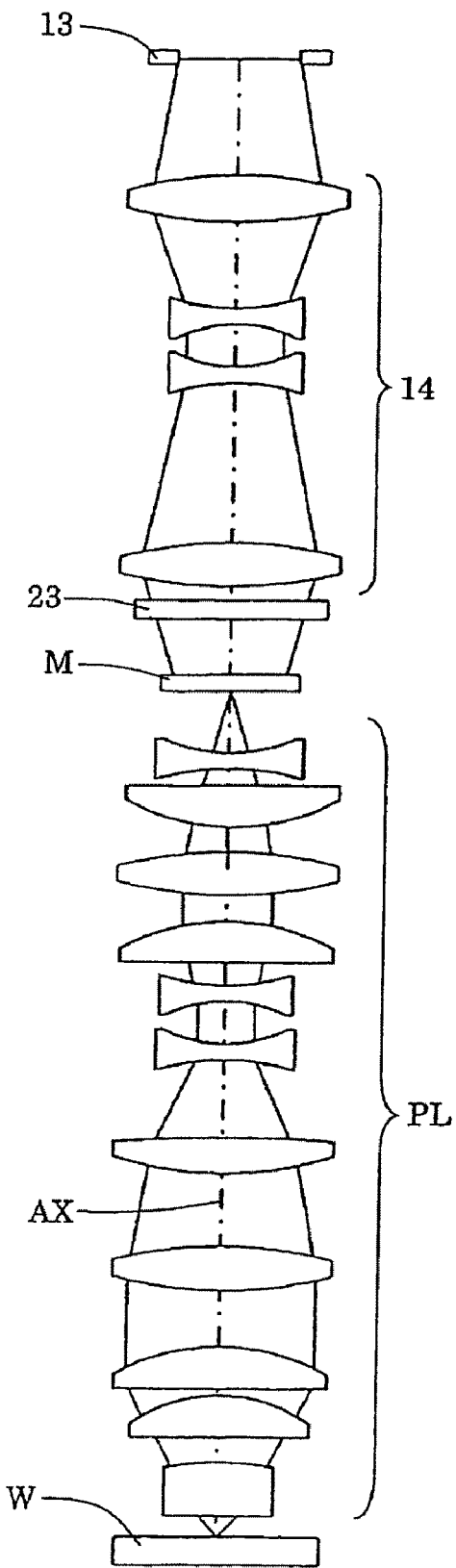
FIG. 20 is a drawing schematically showing a major configuration of an exposure apparatus according to an eighth modification example of the embodiment of the present invention.

FIG. 20 is a drawing schematically showing a major configuration of an exposure apparatus according to an eighth modification example of the present embodiment. In the eighth modification example the configuration from the mask blind 13 to the mask M is similar to that in the seventh modification example of FIG. 19. However, the eighth modification example is different from the seventh modification example in that the birefringent optical rotator 23 is located in the optical path between the imaging optical system 14 and the mask M. Namely, in the eighth modification example the birefringent optical rotator 23 is located in the nearly telecentric optical path near the mask M, in the optical path of the illumination optical system (2-14). As a result, the eighth modification example is also able to achieve the nearly azimuthal polarization state in the lens aperture while suppressing the loss of light quantity, based on the simple configuration, through the action of the birefringent optical rotator 23 as the seventh modification example was.

Figure 21:
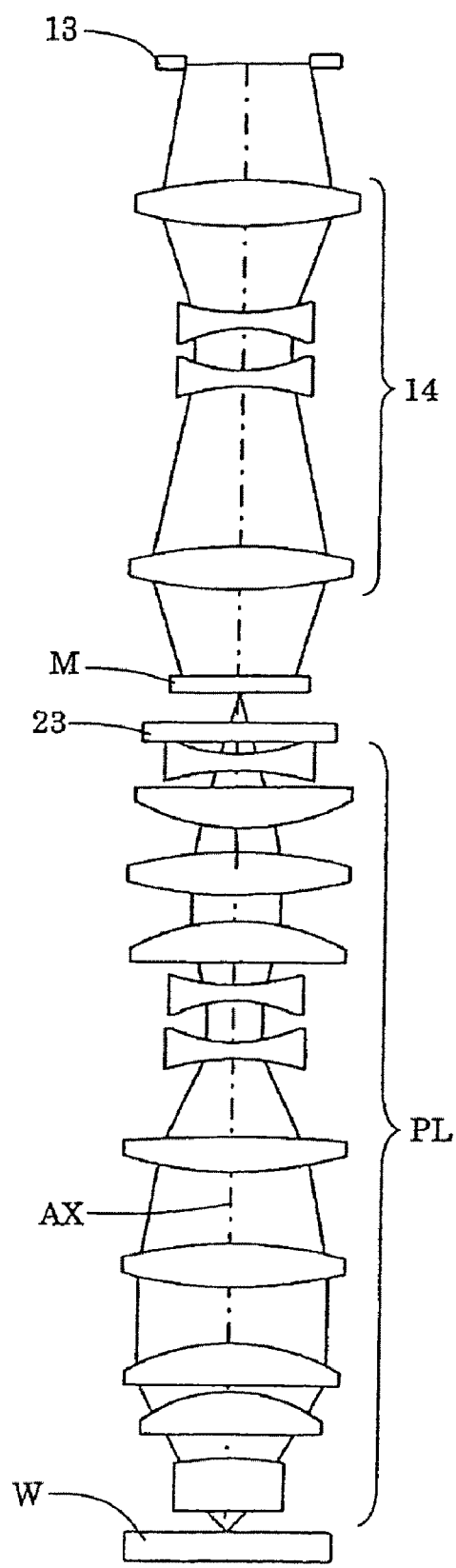
FIG. 21 is a drawing schematically showing a major configuration of an exposure apparatus according to a ninth modification example of the embodiment of the present invention.

FIG. 21 is a drawing schematically showing a major configuration of an exposure apparatus according to a ninth modification example of the present embodiment. In the ninth modification example the configuration from the mask blind 13 to the mask M is similar to that in the seventh modification example of FIG. 19. However, the ninth modification example is different from the seventh modification example in that the birefringent optical rotator 23 is located in the optical path between the mask M and the projection optical system PL. Namely, in the ninth modification example the birefringent optical rotator 23 is located in the nearly telecentric optical path near the mask M (i.e., in the optical path nearly telecentric on the mask M side), in the optical path of the projection optical system PL. As a result, the ninth modification example is also able to achieve the nearly azimuthal polarization state in the lens aperture while suppressing the loss of light quantity, based on the simple configuration, through the action of the birefringent optical rotator 23 as the seventh modification example was.

Figure 22:
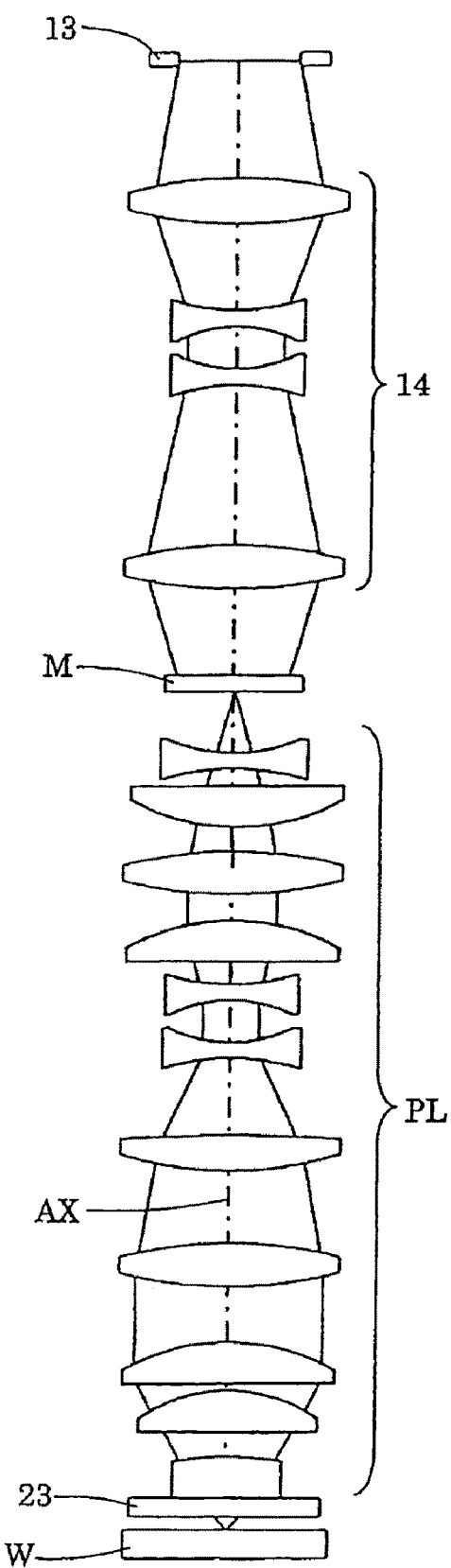
FIG. 22 is a drawing schematically showing a major configuration of an exposure apparatus according to a tenth modification example of the embodiment of the present invention.

FIG. 22 is a drawing schematically showing a major configuration of an exposure apparatus according to a tenth modification example of the present embodiment. In the tenth modification example the configuration from the mask blind 13 to the mask M is similar to that in the seventh modification example of FIG. 19. However, the tenth modification example is different from the seventh modification example in that the birefringent optical rotator 23 is located in the optical path between the projection optical system PL and the wafer W. Namely, in the tenth modification example the birefringent optical rotator 23 is located in the nearly telecentric optical path near the wafer W (i.e., in the optical path nearly telecentric on the wafer W side), in the optical path of the projection optical system PL. As a result, the tenth modification example is also able to achieve the nearly azimuthal polarization state in the lens aperture while suppressing the loss of light quantity, based on the simple configuration, through the action of the birefringent optical rotator 23 as the seventh modification example was.

Figure 23:
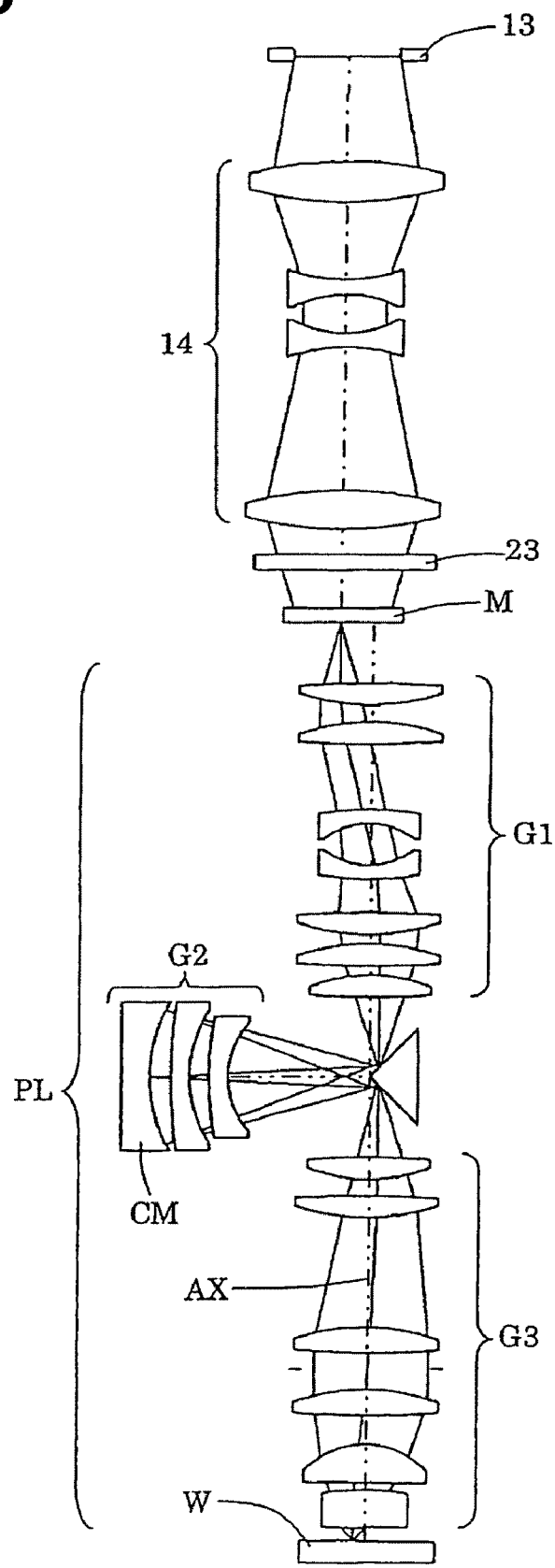
FIG. 23 is a drawing schematically showing a major configuration of an exposure apparatus according to an eleventh modification example of the embodiment of the present invention.

FIG. 23 is a drawing schematically showing a major configuration of an exposure apparatus according to an eleventh modification example of the present embodiment. In the eleventh modification example the configuration from the mask blind 13 to the mask M is similar to that in the fourth modification example of FIG. 15. However, the eleventh modification example is different from the fourth modification example in that the birefringent element 21 and the optical rotator 22 are replaced by a birefringent optical rotator 23 located in the optical path between the imaging optical system 14 and the mask M. Namely, in the eleventh modification example the birefringent optical rotator 23 is located in the nearly telecentric optical path near the mask M, in the optical path of the illumination optical system (2-14). As a result, the eleventh modification example is also able to achieve the nearly azimuthal polarization state in the lens aperture while suppressing the loss of light quantity, based on the simple configuration, through the action of the birefringent optical rotator 23 as the fourth modification example was.

Figure 24:
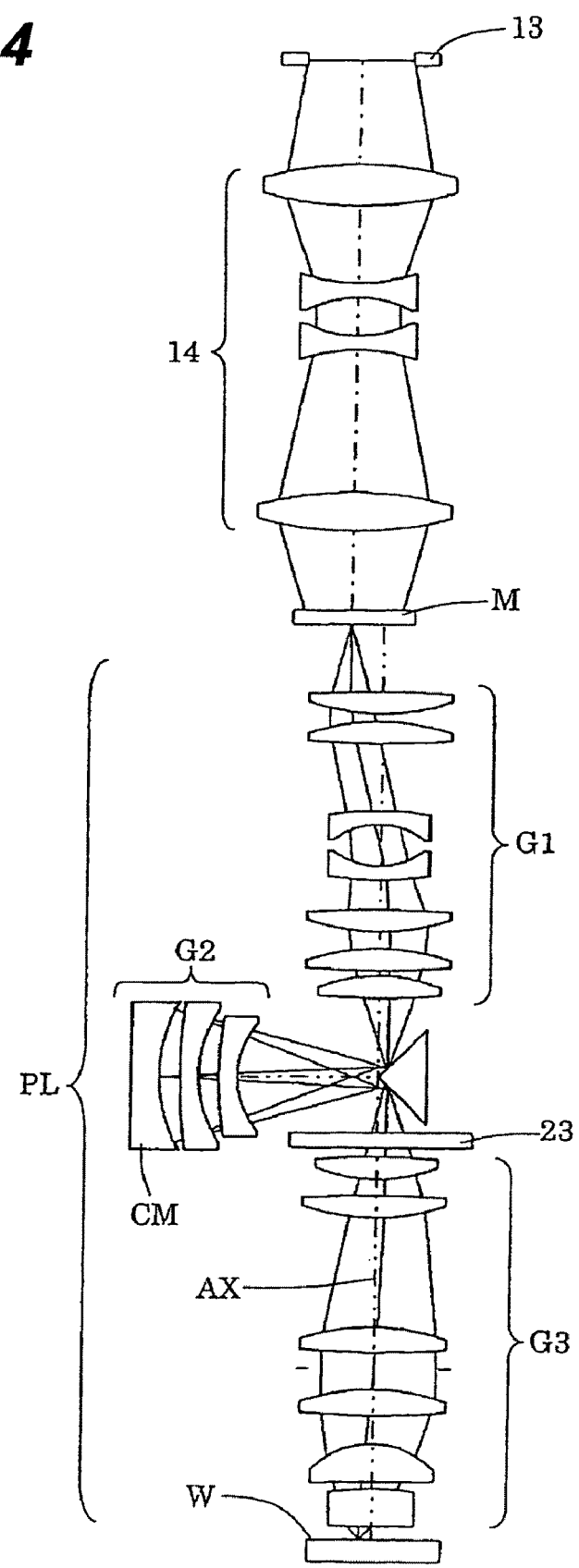
FIG. 24 is a drawing schematically showing a major configuration of an exposure apparatus according to a twelfth modification example of the embodiment of the present invention.

FIG. 24 is a drawing schematically showing a major configuration of an exposure apparatus according to a twelfth modification example of the present embodiment. In the twelfth modification example the configuration from the mask blind 13 to the mask M is similar to that in the eleventh modification example of FIG. 23. In the twelfth modification example the birefringent optical rotator 23 is located at a position optically conjugate with the mask M (a position where a secondary image of mask M is formed) or in a nearly telecentric optical path near the conjugate position, in the optical path between the second imaging optical system G2 and the third imaging optical system G3. As a result, the twelfth modification example is also able to achieve the nearly azimuthal polarization state in the lens aperture while suppressing the loss of light quantity, based on the simple configuration, through the action of the birefringent optical rotator 23 as the eleventh modification example was.

Figure 25:
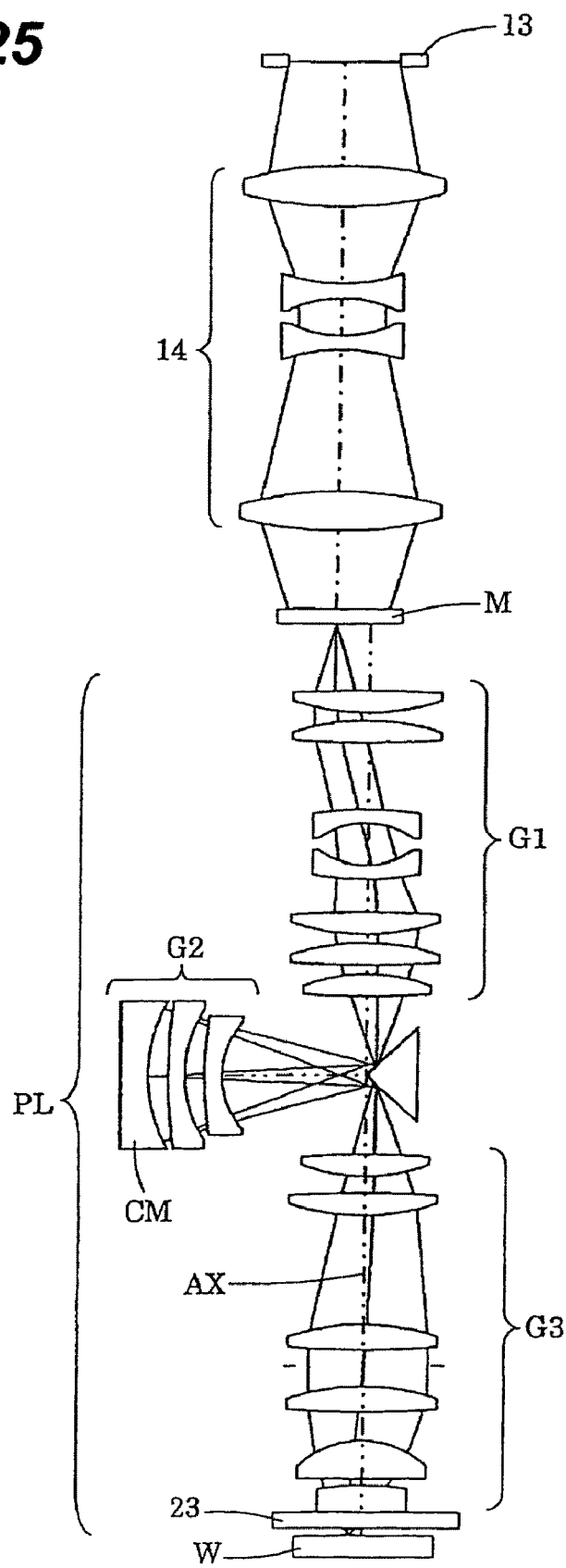
FIG. 25 is a drawing schematically showing a major configuration of an exposure apparatus according to a thirteenth modification example of the embodiment of the present invention.

FIG. 25 is a drawing schematically showing a major configuration of an exposure apparatus according to a thirteenth modification example of the present embodiment. In the thirteenth modification example the configuration from the mask blind 13 to the mask M is similar to that in the eleventh modification example of FIG. 23. However, the thirteenth modification example is different from the eleventh modification example in that the birefringent optical rotator 23 is located in the optical path between the projection optical system PL and the wafer W. Namely, in the thirteenth modification example the birefringent optical rotator 23 is located in a nearly telecentric optical path near the wafer W (i.e., in an optical path nearly telecentric on the wafer W side), in the optical path of the projection optical system PL. As a result, the thirteenth modification example is also able to achieve the nearly azimuthal polarization state in the lens aperture while suppressing the loss of light quantity, based on the simple configuration, through the action of the birefringent optical rotator 23 as the eleventh modification example was. In the twelfth modification example and the thirteenth modification example, the birefringent optical rotator 23 is located in the optical path on the wafer W side with respect to the optical path folding mirror in the projection optical system PL. In the case of this configuration, as in the case of the aforementioned sixth modification example, even if there occurs a phase difference due to reflection between the p-polarization and the s-polarization for the optical path folding mirror, the polarization state after the reflection can be nearly circular polarization when the polarization state impinging upon the optical path folding mirror is set to elliptic polarization. Therefore, the thirteenth modification example is more preferably adopted than the aforementioned eleventh modification example in the case where the optical path folding mirror is located in the projection optical system.

Figure 26:
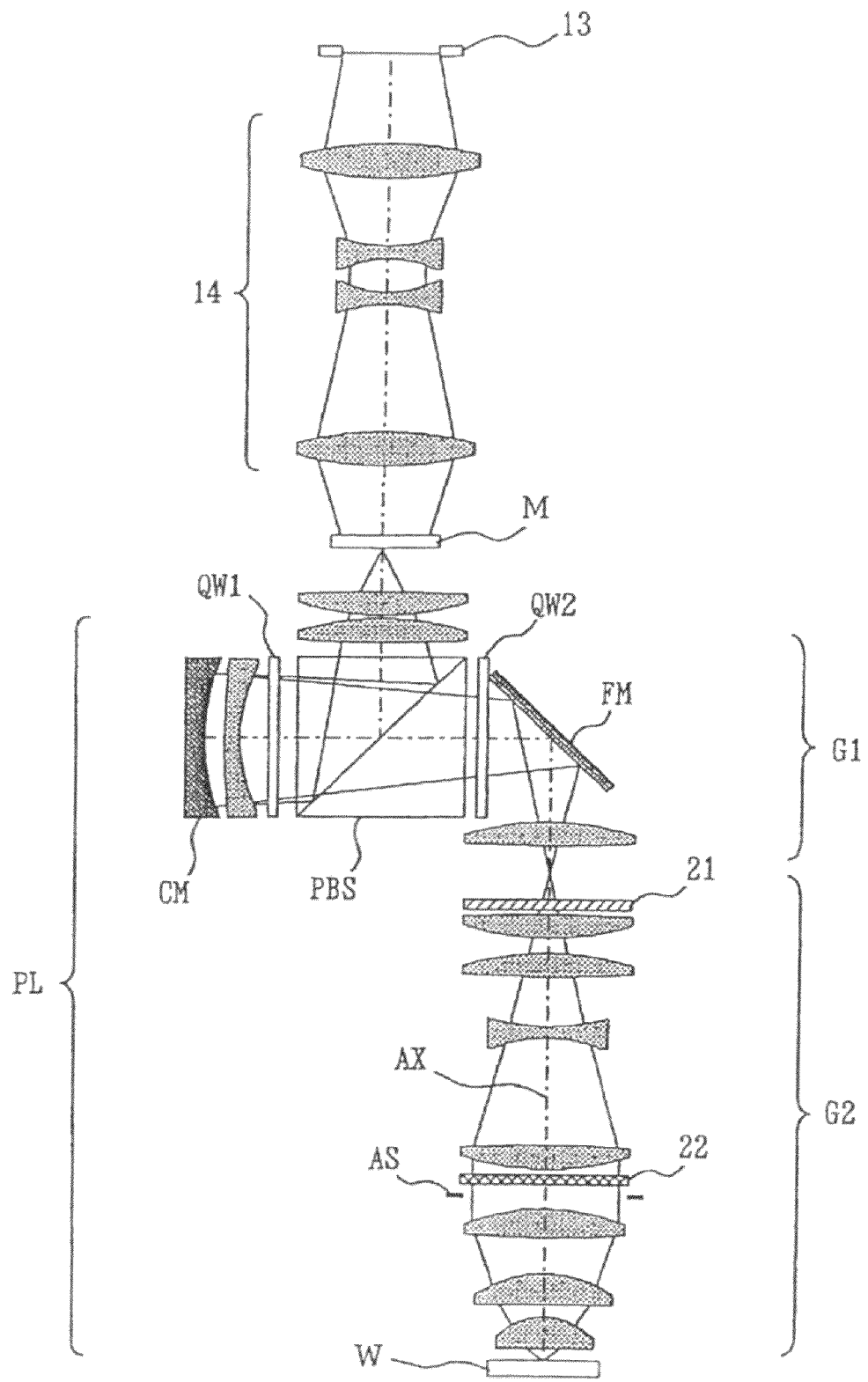
FIG. 26 is a drawing schematically showing a major configuration of an exposure apparatus according to a fourteenth modification example of the embodiment of the present invention.

FIG. 26 is a drawing schematically showing a major configuration of an exposure apparatus according to a fourteenth modification example of the present embodiment. In the fourteenth modification example the configuration from the mask blind 13 to the mask M is similar to that in the embodiment shown in FIG. 25. However, the fourteenth modification example is different from the exposure apparatus of the embodiment of FIG. 25 in that, while the mask M is illuminated by circularly polarized light in the exposure apparatus of the embodiment of FIG. 25, the mask M is illuminated by linearly polarized light in the exposure apparatus of the fourteenth modification example and in that, while the projection optical system PL of the embodiment of FIG. 25 is a catadioptric optical system of the threefold imaging type including the concave mirror CM and two optical path folding mirrors, the projection optical system PL of the fourteenth modification example is a catadioptric optical system of a twofold imaging type including a concave mirror CM, a polarization beam splitter PBS, and one optical path folding mirror FM.

In FIG. 26, the projection optical system PL in the fourteenth modification example is an optical system telecentric on the mask M side and on the wafer W side, and is comprised of a first imaging optical system G1 for forming an intermediate image of mask M and a second imaging optical system G2 for forming an image of this intermediate image on a wafer W as a photosensitive substrate.

The first imaging optical system G1 is comprised of a first lens unit located nearest to the mask side (mask-side field lens unit), a polarization beam splitter PBS for reflecting a light beam of linearly polarized light having passed through the first lens unit, a first quarter-wave plate QW1 for converting the light beam of linearly polarized light reflected by the polarization beam splitter PBS, into a light beam of circularly polarized light, a concave mirror CM for reflecting the light beam having passed through the first quarter-wave plate QW1, a negative lens unit located in the optical path between the concave mirror CM and the first quarter-wave plate QW1, a second quarter-wave plate QW2 for converting the light beam of linearly polarized light transmitted via the negative lens unit and the first quarter-wave plate by the polarization beam splitter PBS, into a light beam of circularly polarized light, a optical path folding mirror FM for deflecting the optical path of the light beam from the polarization beam splitter PBS by about 90°, and a positive lens unit located between the polarization beam splitter PBS and the intermediate image point (intermediate-image-side field lens unit). This intermediate-image-side field lens unit keeps the optical path on the intermediate image side of the first imaging optical system G1 (the optical path between the first imaging optical system G1 and the second imaging optical system G2) approximately telecentric.

The second imaging optical system G2 has a structure similar to the dioptric projection optical system PL in the fourth modification example shown in FIG. 14, in which the birefringent element 21 is located in the optical path between the second imaging optical system G2 and the intermediate image point and in which the optical rotator 22 is located at a predetermined position in the optical path of the second imaging optical system G2, preferably, at a position near an aperture stop AS.

Then the linearly polarized light from the mask M passes through the first lens unit, is then reflected by the polarization beam splitter PBS, and thereafter travels through the first quarter-wave plate QW1 to be converted into circularly polarized light, and the circularly polarized light travels through the negative lens unit to reach the concave mirror CM. The light beam of circularly polarized light reflected by the concave mirror CM travels again through the negative lens unit, and then passes through the first quarter-wave plate QW1 to be converted into linearly polarized light, and the linearly polarized light passes through the polarization beam splitter PBS to reach the second quarter-wave plate QW2. This light beam is converted into circularly polarized light by the second quarter-wave plate QW2, and then the linearly polarized light is reflected by the optical path folding mirror FM and travels through the positive lens unit being the intermediate-image-side field lens unit, to form an intermediate image of the mask M. Light from this intermediate image then travels through the birefringent element 21 to be incident to the second imaging optical system G2, and thereafter passes through the optical rotator 22 in this second imaging optical system G2 to form a reduced image as a secondary image of the mask M on the image plane. This reduced image is a mirror image of the mask M (which is an image having a negative lateral magnification in the direction in the plane of the drawing and a positive lateral magnification in the direction normal to the plane of the drawing).

In the fourteenth modification example the birefringent element 21 is located in the nearly telecentric optical path near the intermediate image point, in the optical path of the projection optical system PL. Furthermore, the optical rotator 22 is located near the pupil position of the projection optical system PL. As a result, the fourteenth modification example is also able to achieve the nearly azimuthal polarization state in the lens aperture while suppressing the loss of light quantity, based on the simple configuration, through collaboration of the birefringent element 21 and the optical rotator 22 as the embodiment of FIG. 25 was.

In the fourteenth modification example, the illumination optical system may be arranged to illuminate the mask M with circularly polarized light and in this case, a third quarter-wave plate is located in the optical path between the mask M and the polarization beam splitter PBS in the projection optical system PL so as to guide linearly polarized light to the polarization beam splitter. In the fourteenth modification example the polarization beam splitter PBS is arranged to reflect the light beam from the mask M, but the polarization beam splitter PBS may be arranged to transmit the light beam from the mask M (so that the optical system from the mask M to the concave mirror CM is aligned on a straight line).

Figure 27:
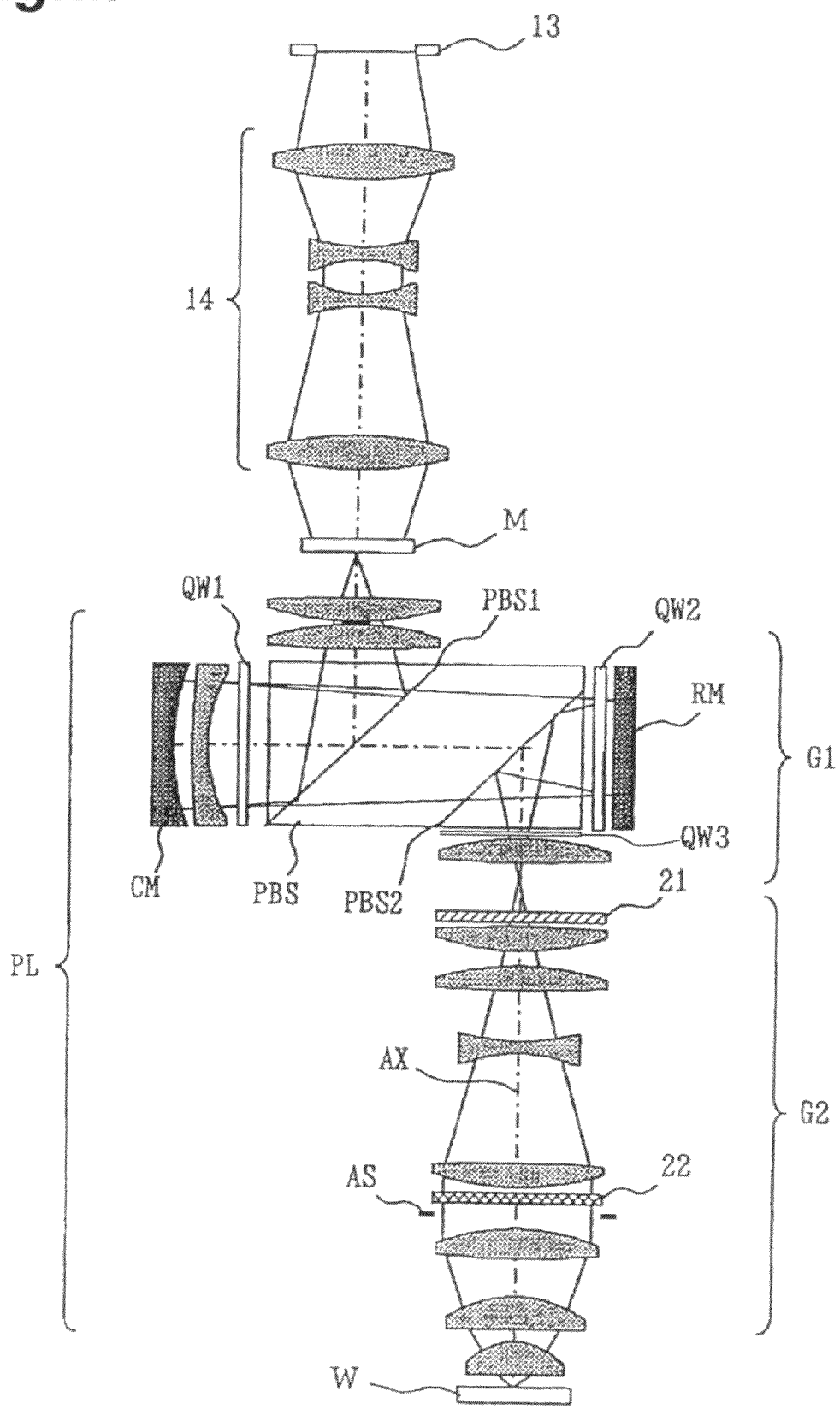
FIG. 27 is a drawing schematically showing a major configuration of an exposure apparatus according to a fifteenth modification example of the embodiment of the present invention.

FIG. 27 is a drawing schematically showing a major configuration of an exposure apparatus according to a fifteenth modification example of the present embodiment. In the fifteenth modification example the configuration from the mask blind 13 to the mask M and the configuration from the intermediate image point to the wafer W are similar to those in the embodiment (fourteenth modification example) shown in FIG. 26. However, the fifteenth modification example is different from the fourteenth modification example in that, while the projection optical system PL of the fourteenth modification example is arranged to guide the light beam from the mask M to the wafer W while reflecting it three times, the projection optical system PL of the fifteenth modification example is arranged to guide the light beam from the mask M to the wafer W while reflecting it four times.

In FIG. 27, the projection optical system PL in the fifteenth modification example is an optical system telecentric on the mask M side and on the wafer W side as the projection optical system PL in the fourteenth modification example was, and is comprised of a first imaging optical system G1 for forming an intermediate image of the mask M, and a second imaging optical system G2 for forming an image of this intermediate image on the wafer W as a photosensitive substrate.

The first imaging optical system G1 is comprised of a first lens unit located nearest to the mask side (mask-side field lens unit), a polarization beam splitter PBS having a first polarization splitting surface PBS 1 for reflecting a light beam of linearly polarized light having passed through the first lens unit, a first quarter-wave plate QW1 for converting the light beam of linearly polarized light reflected by the first polarization splitting surface PBS1, into a light beam of circularly polarized light, a concave mirror CM for reflecting the light beam having passed through the first quarter-wave plate QW1, a negative lens unit located in the optical path between the concave mirror CM and the first quarter-wave plate QW1, a second polarization splitting surface PBS2 for transmitting a light beam of linearly polarized light transmitted via the negative lens unit and the first quarter-wave plate by the first polarization splitting surface PBS1, a second quarter-wave plate QW2 for converting the light beam of linearly polarized light transmitted by the second polarization splitting surface PBS2, into a light beam of circularly polarized light, a return mirror RM having a reflecting plane for returning the light beam of circularly polarized light from the second quarter-wave plate QW2, a third quarter-wave plate QW3 for converting a light beam of linearly polarized light reflected by the second polarization splitting surface PBS2 after the round-trip passage through the second quarter-wave plate QW2, into a light beam of circularly polarized light, and a positive lens unit (intermediate-image-side field lens unit) located between the second polarization splitting surface PBS2 and the intermediate image point. This intermediate-image-side field lens unit keeps the optical path on the intermediate image side of the first imaging optical system G1 (the optical path between the first imaging optical system G1 and the second imaging optical system G2) nearly telecentric.

The second imaging optical system G2 has a structure similar to the catadioptric projection optical system PL in the fourteenth modification example shown in FIG. 26, in which the birefringent element 21 is located in the optical path between the second imaging optical system G2 and the intermediate image point and in which the optical rotator 22 is located at a predetermined position in the optical path of the second imaging optical system G2, preferably, at a position near an aperture stop AS.

The light beam of linearly polarized light from the mask M travels through the first lens unit, is then reflected by the first polarization splitting surface PBS1 of the polarization beam splitter PBS, and then travels through the first quarter-wave plate QW1 to be converted into circularly polarized light, and the circularly polarized light travels through the negative lens unit to reach the concave mirror CM. The light beam of circularly polarized light reflected by the concave mirror CM travels again through the negative lens unit and thereafter passes through the first quarter-wave plate QW1 to be converted into linearly polarized light. The linearly polarized light passes through the first polarization splitting surface PBS1 and the second polarization splitting surface PBS2 of the polarization beam splitter PBS to reach the second quarter-wave plate QW2. This light beam is converted into circularly polarized light by the second quarter-wave plate QW2, and the circularly polarized light then reaches the return mirror RM. The light beam of circularly polarized light reflected by the return mirror RM travels through the second quarter-wave plate QW2 to be converted into linearly polarized light, and then the linearly polarized light is reflected by the second polarization splitting surface PBS2 of the polarization beam splitter PBS to reach the third quarter-wave plate QW3. The light beam of linearly polarized light incident to the third quarter-wave plate QW3 is converted into a light beam of circularly polarized light by this third quarter-wave plate QW3, and the light beam of circularly polarized light then travels through the positive lens unit being the intermediate-image-side field lens unit, to form an intermediate image of the mask M. Light from this intermediate image travels through the birefringent element 21 to be incident to the second imaging optical system G2, and then passes through the optical rotator in this second imaging optical system G2 to form a reduced image as a secondary image of the mask M on the image plane. This reduced image is a front image of the mask M (an image having a positive lateral magnification in the direction in the plane of the drawing and a positive lateral magnification in the direction perpendicular to the plane of the drawing, i.e., an erect image).

In the fifteenth modification example the birefringent element 21 is also located in the nearly telecentric optical path near the intermediate image point, in the optical path of the projection optical system PL. Furthermore, the optical rotator 22 is located near the pupil position of the projection optical system PL. As a result, the fifteenth modification example is able to achieve the nearly azimuthal polarization state in the lens aperture while suppressing the loss of light quantity, based on the simple configuration, through collaboration of the birefringent element 21 and the optical rotator 22 as the embodiment of FIG. 26 was.

In the fifteenth modification example the illumination optical system may be arranged to illuminate the mask M with circularly polarized light and in this case, the fourth quarter-wave plate may be located in the optical path between the mask M and the polarization beam splitter PBS in the projection optical system PL so as to guide linearly polarized light to the polarization beam splitter PBS. The fifteenth modification example is arranged to reflect the light beam from the mask M by the first polarization splitting surface PBS1 of the polarization beam splitter PBS, but the optical system may be arranged so that the light beam from the mask M is transmitted by the first polarization splitting surface PBS1 (so that the optical system from the mask M to the concave mirror CM is aligned on a straight line). In the fifteenth modification example the second polarization splitting surface PBS2 of the polarization beam splitter PBS is arranged to reflect the light beam from the return mirror RM, but the optical system may also be arranged so that the second polarization splitting surface PBS2 transmits the light beam from the return mirror (so that the optical system from the return mirror RM to the wafer W is aligned on a straight line). At this time, the light beam from the first polarization splitting surface PBS1 is reflected by the second polarization splitting surface PBS2.

The following controls may be properly performed according to the shape of the pattern as an exposed object on the mask M: the control of the polarization state by the polarization state converter 4, the control of the exchange operation of the diffractive optical element, and the control of the operation of the axicon system 8 as an annular ratio changing means as described above. It is contemplated in the above-described embodiment and modification examples that when the polarization state is set to the linear polarization state or the unpolarized state through the action of the polarization state converter 4, the polarization state is affected by the birefringent element 21 or the birefringent optical rotator 23 disposed in the optical path between the mask M and the wafer W. In that case, the birefringent element 21 or the birefringent optical rotator 23 may be retracted from the optical path, or the birefringent element 21 or the birefringent optical rotator 23 may be replaced with an optically transparent member without birefringence (e.g., a plane-parallel plate made of silica or the like) as occasion may demand. Such retracting operation or replacing operation of the birefringent element 21 or the birefringent optical rotator 23 may also be controlled in synchronism with the aforementioned controls.

The exposure apparatus of the aforementioned embodiment can be used to fabricate micro devices (semiconductor devices, image pickup devices, liquid-crystal display devices, thin-film magnetic heads, etc.) by illuminating a mask (reticle) by the illumination optical apparatus (illumination block) and projecting a pattern to be transferred, formed in the mask, onto a photosensitive substrate with the projection optical system (exposure block). An example of a technique of forming a predetermined circuit pattern in a wafer or the like as a photosensitive substrate with the exposure apparatus of the aforementioned embodiment to obtain semiconductor devices as micro devices will be described below with reference to the flowchart of FIG. 28.

Figure 28:
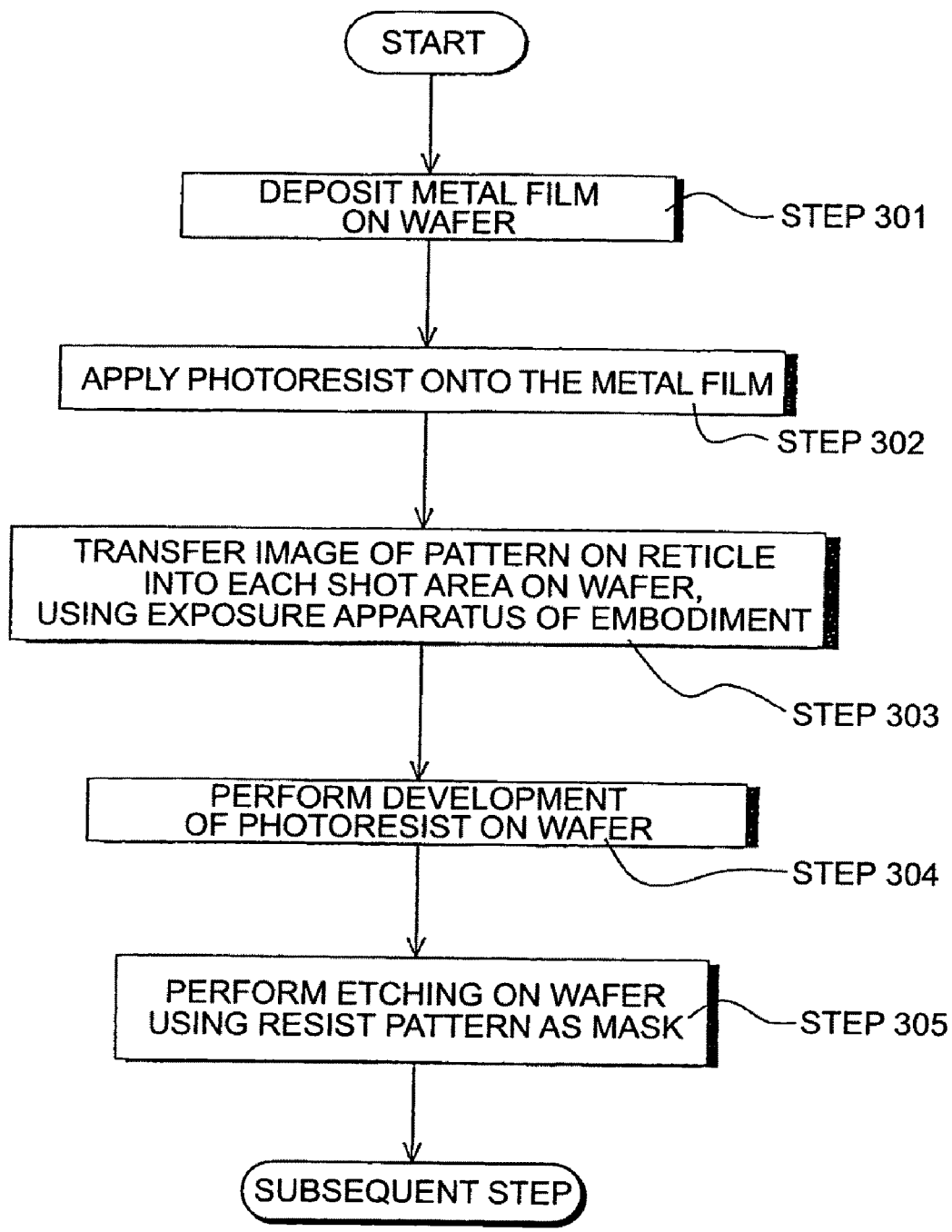
FIG. 28 is a flowchart of a technique of fabricating semiconductor devices as micro devices.

The first block 301 in FIG. 28 is to deposit a metal film on each wafer in one lot. The next block 302 is to apply a photoresist onto the metal film on each wafer in the lot. The subsequent block 303 is to sequentially transfer an image of a pattern on the mask into each shot area on each wafer in the lot through the projection optical system, using the exposure apparatus of the aforementioned embodiment. The subsequent block 304 is to perform development of the photoresist on each wafer in the lot and the subsequent block 305 is to perform etching on each wafer in the lot, using the resist pattern as a mask and thereby to form a circuit pattern corresponding to the pattern on the mask, in each shot area on each wafer. Subsequent blocks include formation of circuit patterns in upper layers, and others, thereby fabricating devices such as semiconductor devices. The above-described semiconductor device fabrication method permits us to obtain semiconductor devices with extremely fine circuit patterns at high throughput.

Figure 29:
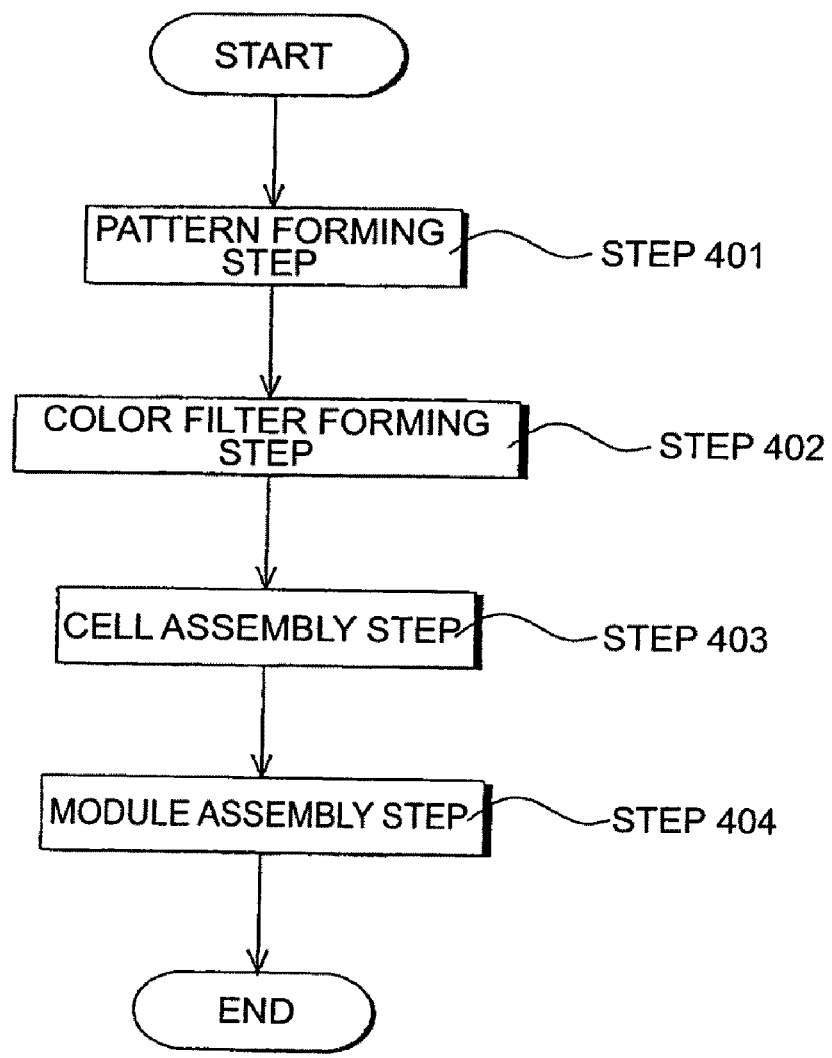
FIG. 29 is a flowchart of a technique of fabricating a liquid-crystal display element as a micro device.

The exposure apparatus of the aforementioned embodiment can also be used to fabricate a liquid-crystal display device as a micro device by forming predetermined patterns (circuit pattern, electrode pattern, etc.) on plates (glass substrates). An example of a technique for fabricating the liquid-crystal display device will be described below with reference to the flowchart of FIG. 29. In FIG. 29, a pattern forming block 401 is to execute a so-called photolithography block to transfer a pattern of a mask onto a photosensitive substrate (glass substrate coated with a resist, or the like) with the exposure apparatus of the aforementioned embodiment. This photolithography block results in forming the predetermined pattern including a number of electrodes and others on the photosensitive substrate. Thereafter, the exposed substrate is subjected to each of blocks such as development, etching, and resist removal, whereby a predetermined pattern is formed on the substrate. Thereafter, the process transfers to next color filter forming block 402.

The next color filter forming block 402 is to form a color filter in which a number of sets of three dots corresponding to R (Red), G (Green), and B (Blue) are arrayed in a matrix pattern, or in which sets of three stripe filters of R, G, and B are arrayed as a plurality of lines along the horizontal scan line direction. After completion of the color filter forming block 402, a cell assembling block 403 is carried out. The cell assembling block 403 is to assemble a liquid crystal panel (liquid crystal cell), using the substrate with the predetermined pattern obtained in the pattern forming block 401, the color filter obtained in the color filter forming block 402, and so on.

In the cell assembling block 403, for example, a liquid crystal is poured into between the substrate with the predetermined pattern obtained in the pattern forming block 401 and the color filter obtained in the color filter forming block 402, to fabricate a liquid crystal panel (liquid crystal cell). The subsequent module assembling block 404 is to install each of components such as an electric circuit, a backlight, etc. for display operation of the assembled liquid crystal panel (liquid crystal cell) to complete the liquid-crystal display device. The above-described method of fabricating the liquid-crystal display device permits us to obtain the liquid-crystal display device with an extremely fine circuit pattern at high throughput.

In the aforementioned embodiment the exposure light was the KrF excimer laser light (wavelength: 248 nm) or the ArF excimer laser light (wavelength: 193 nm), but, without having to be limited to this, the present invention can also be applied to the other appropriate laser light sources, e.g., an $F_2$ laser light source for supplying laser light of wavelength of 157 nm. Furthermore, the aforementioned embodiment described the present invention with the example of the exposure apparatus provided with the illumination optical apparatus, but it is apparent that the present invention can be applied to the ordinary illumination optical apparatus for illuminating a surface to be illuminated, except for the masks and wafers.

In the aforementioned embodiment, it is also possible to adopt a technique of filling the optical path between the projection optical system and the photosensitive substrate with a medium having the refractive index of more than 1.1 (typically, a liquid), i.e., the so-called liquid immersion method. When the liquid fills the space between the projection optical system and the photosensitive material such as the resist applied on the surface of the photosensitive substrate, the transmittance on the resist surface becomes higher for diffracted light of the s-polarization component (TE polarization component) contributing to improvement in contrast than when air (gas) fills the space between the projection optical system and the resist applied on the surface of the photosensitive substrate; therefore, high imaging performance can be achieved even if the numerical aperture NA of the projection optical system is over 1.0. In this case, the technique of filling the liquid in the optical path between the projection optical system and the photosensitive substrate can be one selected from the method of locally filling the space with the liquid as disclosed in International Publication WO99/49504, the method of moving a stage holding a substrate as an exposed object, in a liquid bath as disclosed in Japanese Patent Application Laid-Open No. 6-124873, the method of forming a liquid bath of a predetermined depth on a stage and holding a substrate in the liquid bath as disclosed in Japanese Patent Application Laid-Open No. 10-303114, and so on. The teachings of International Publication WO99/49504, Japanese Patent Application Laid-Open No. 6-124873, and Japanese Patent Application Laid-Open No. 10-303114 are hereby incorporated by reference.

The liquid is preferably one that is transparent to exposure light, that has the refractive index as high as possible, and that is stable against the projection optical system and the photoresist applied on the surface of the substrate; for example, where the KrF excimer laser light or the ArF excimer laser light is used as exposure light, the liquid can be pure water or deionized water. Where the exposure light is the $F_2$ laser light, the liquid can be a fluorine-based liquid, for example, such as fluorine oil or perfluoro polyether (PFPE) capable of transmitting the F₂ laser light. The present invention is also applicable to twin-stage type exposure apparatus. The structure and exposure operation of the twin-stage type exposure apparatus are disclosed, for example, in Japanese Patent Applications Laid-Open No. 10-163099 and Laid-Open No. 10-214783 (corresponding to U.S. Pat. No. 6,341,007, No. 6,400,441, No. 6,549,269, and No. 6,590,634), Published Japanese translation of PCT Application No. 2000-505958 (corresponding to U.S. Pat. No. 5,969,441), or U.S. Pat. No. 6,208,407. The teachings of U.S. Pat. Nos. 6,341,007, 6,400, 441, 6,549,269, 6,590,634, 5,969,441, and 6,208,407 are hereby incorporated by reference.

The invention is not limited to the foregoing embodiments but various changes and modifications of its components may be made without departing from the scope of the present invention. Also, the components disclosed in the embodiments may be assembled in any combination for embodying the present invention. For example, some of the components may be omitted from all components disclosed in the embodiments. Further, components in different embodiments may be appropriately combined.

The invention claimed is:

1. An optical system including an optical axis, comprising:
a first optically transparent member which is made of a uniaxial crystal material and a crystallographic axis of which is arranged substantially in parallel with the optical axis;
a second optically transparent member which is made of a uniaxial crystal material and a crystallographic axis of which is arranged substantially in parallel with the optical axis; and
an optical member located in an optical path between the first optically transparent member and the second optically transparent member and including a predetermined power,
wherein a beam bundle of substantially spherical waves in a substantially circular polarization state is incident to the first optically transparent member.

2. The optical system according to claim 1,
wherein the first optically transparent member is made of a material selected from rock crystal, magnesium fluoride, and lithium aluminum calcium fluoride, and
wherein the second optically transparent member is made of rock crystal.

3. The optical system according to claim 1,
wherein the first optically transparent member achieves a substantially circumferential distribution or a substantially radial distribution as a fast axis distribution in a lens aperture, and
wherein the second optically transparent member rotates a polarization state in the lens aperture.

4. The optical system according to claim 1,
wherein the optical member including the predetermined power comprises a lens.

5. The optical system according to claim 1,
said optical system including an illumination optical system which illuminates a surface to be illuminated.

6. The optical system according to claim 5,
wherein the first optically transparent member is located near the surface to be illuminated, or at or near a position optically conjugate with the surface to be illuminated, in an optical path of the illumination optical system, and
wherein the optical member including the predetermined power includes an imaging optical system which establishes the position optically conjugate with the surface to be illuminated.

7. The optical system according to claim 6,
wherein the first optically transparent member is located at or near the position optically conjugate with the surface to be illuminated, in the optical path of the illumination optical system, and
wherein the second optically transparent member is located in the imaging optical system in the illumination optical system.

8. The optical system according to claim 6,
wherein the illumination optical system forms a secondary light source including a predetermined optical intensity distribution, on an illumination pupil surface, and
wherein the predetermined optical intensity distribution of the secondary light source is so set that an optical intensity in a pupil center region being a region on the illumination pupil and including the optical axis is smaller than an optical intensity in a region around the pupil center region.

9. The optical system according to claim 8,
wherein the predetermined optical intensity distribution of the secondary light source includes an optical intensity distribution of an annular shape or multi-pole shape.

10. The optical system according to claim 1,
said optical system being an optical system for lithography.

11. An optical system including an optical axis, comprising:
a first optically transparent member which is made of a uniaxial crystal material and a crystallographic axis of which is arranged substantially in parallel with the optical axis, the first optically transparent member being arranged at a first position; and
a second optically transparent member which is at a position different from the first position in a direction of the optical axis and is made of uniaxial crystal and a crystallographic axis of which is arranged substantially in parallel with the optical axis,
wherein a beam bundle of substantially spherical waves in a substantially circular polarization state is incident to the first optically transparent member.

12. The optical system according to claim 11, wherein the first optically transparent member is made of material selected from rock crystal and MgF₂ or LiCaAlF₆; and
the second optically transparent member is made of rock crystal.

13. The optical system according to claim 12, further comprising an optical member arranged in an optical path between the first optically transparent member and the second optically transparent member and having a predetermined power.

14. The optical system according to claim 13, wherein the optical member with the predetermined power comprises a lens.

15. The optical system according to claim 13, wherein the optical system comprises an illumination optical system for illuminating a plane to be illuminated.

16. The optical system according to claim 15 wherein the first optically transparent member is arranged at a position adjacent to the plane to be illuminated or at a position optically conjugate with the plane to be illuminated or adjacent thereto, in an optical path of the illumination optical system; and
the optical member with the predetermined power comprises an imaging optical system for forming a position optically conjugate with the plane to be illuminated.

17. The optical system according to claim 16, wherein
the first optically transparent member is arranged at a position optically conjugate with the plane to be illuminated or adjacent thereto, in an optical path of the illumination optical system; and
the second optically transparent member is arranged within the imaging optical system located in the illumination optical system.

18. The optical system according to claim 16, wherein
the illumination optical system forms a secondary light source having a predetermined optical intensity distribution, on an illumination pupil plane; and
the predetermined optical intensity distribution of the secondary light source is so set that an optical intensity in a pupil center region being a region on the illumination pupil and including an optical axis smaller than an optical intensity in a region around the pupil center region.

19. The optical system according to claim 18, wherein the predetermined optical intensity distribution of the secondary light source has an optical intensity distribution of an annular shape or multi-pole shape.

20. The optical system according to claim 11, wherein the optical system is an optical system for lithography.

21. The optical system according to claim 11, wherein the first optically transparent member achieves a substantially circumferential distribution or a substantially radial distribution as a fast axis distribution in a lens aperture; and
the second optically transparent member rotates a polarization state of the lens aperture.

22. The optical system according to claim 21, further comprising an optical member arranged in an optical path between the first optically transparent member and the second optically transparent member and having a predetermined power.

23. The optical system according to claim 22, wherein the optical member with the predetermined power comprises a lens.

24. The optical system according to claim 22, wherein the optical system comprises an illumination optical system for illuminating a plane to be illuminated.

25. The optical system according to claim 24, wherein
the first optically transparent member is arranged at a position adjacent to the plane to be illuminated or at a position optically conjugate with the plane to be illuminated or adjacent thereto, in an optical path of the illumination optical system; and
the optical member with the predetermined power comprises an imaging optical system for forming a position optically conjugate with the plane to be illuminated.

26. The optical system according to claim 24, wherein
the first optically transparent member is arranged at a position optically conjugate with the plane to be illuminated or adjacent thereto, in an optical path of the illumination optical system; and
the second optically transparent member is arranged within the imaging optical system located in the illumination optical system.

27. The optical system according to claim 24, wherein
the illumination optical system forms a secondary light source having a predetermined optical intensity distribution, on an illumination pupil plane; and
the predetermined optical intensity distribution of the secondary light source is so set that an optical intensity in a pupil center region being a region on the illumination pupil and including an optical axis smaller than an optical intensity in a region around the pupil center region.

28. The optical system according to claim 27, wherein the predetermined optical intensity distribution of the secondary light source has an optical intensity distribution of an annular shape or multi-pole shape.

29. The optical system according to claim 11, wherein
the first position is located in a first plane crossing the optical axis; and
the position different from the first position is located in a second plane different from the first plane and crossing the optical axis.

30. The optical system according to claim 11, wherein
the first optically transparent member is arranged so as to include the optical axis; and
the second optically transparent member is arranged so as to include the optical axis.

31. The optical system according to claim 11, wherein
the optical system comprises an illumination optical system for illuminating a plane to be illuminated, and
the first and second transparent members are included in the illumination optical system.

* * * * *